United States Patent
Hsu et al.

(10) Patent No.: US 12,057,506 B2
(45) Date of Patent: Aug. 6, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Chia-Ming Hsu, Hualien County (TW); Da-Wen Lin, Hsinchu (TW); Clement Hsingjen Wann, Carmel, NY (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 460 days.

(21) Appl. No.: 17/370,543

(22) Filed: Jul. 8, 2021

(65) Prior Publication Data

US 2023/0008020 A1    Jan. 12, 2023

(51) Int. Cl.
   *H01L 29/78* (2006.01)
   *H01L 21/762* (2006.01)
   *H01L 29/417* (2006.01)
   *H01L 29/66* (2006.01)

(52) U.S. Cl.
   CPC .......... *H01L 29/785* (2013.01); *H01L 21/762* (2013.01); *H01L 29/41791* (2013.01); *H01L 29/66795* (2013.01)

(58) Field of Classification Search
   CPC ... H01L 29/785–7856; H01L 29/41791; H01L 29/66795–66818; H01L 29/04–045; H01L 29/16–1608; H01L 29/18–185; H01L 29/22–2206; H01L 29/36–365; H01L 29/7846; H01L 29/0649–0653; H01L 29/4908; H01L 29/66742–6678; H01L 29/7856–78696; H01L 21/823821; H01L 21/845; H01L 21/823431; H01L 21/76205–7621; H01L 21/76224–76237; H01L 21/76283–76286; H01L 21/76264; H01L 21/76289; H01L 21/764; H01L 27/0886; H01L 27/0924; H01L 27/10826; H01L 27/10879; H01L 27/1211; H01L 27/12–13; H01L 2029/7857–7858; H01L 2924/13067; H01L 2924/13069; H01L 2221/1042; H01L 2221/1047
   See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |

(Continued)

*Primary Examiner* — Cuong B Nguyen
*Assistant Examiner* — Anthony A Pulatov
(74) *Attorney, Agent, or Firm* — Birch, Stewart, Kolasch & Birch, LLP

(57) ABSTRACT

A semiconductor device includes a substrate, an isolation structure, a semiconductor fin, a semiconductor layer, and a gate structure. The isolation structure is disposed over the substrate. The semiconductor fin extends from the substrate and in contact with the isolation structure. The semiconductor layer is disposed on and in contact with the isolation structure. The gate structure covers the semiconductor layer and spaced apart from the semiconductor fin.

20 Claims, 33 Drawing Sheets

(56) References Cited

U.S. PATENT DOCUMENTS

| | | |
|---|---|---|
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 10,269,901 B2 | 4/2019 | Ching et al. |
| 10,312,327 B2 | 6/2019 | Chang et al. |
| 2017/0194213 A1 | 7/2017 | Ching et al. |
| 2020/0006336 A1* | 1/2020 | Lung ................. H01L 29/24 |
| 2020/0287024 A1* | 9/2020 | Dewey ............. H01L 27/0924 |

* cited by examiner

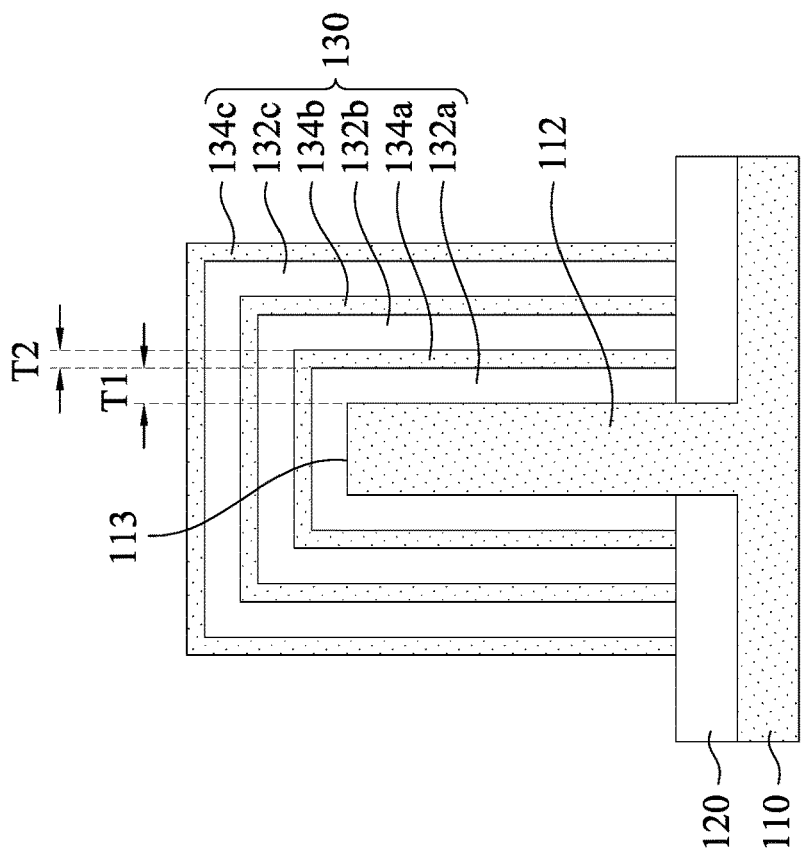
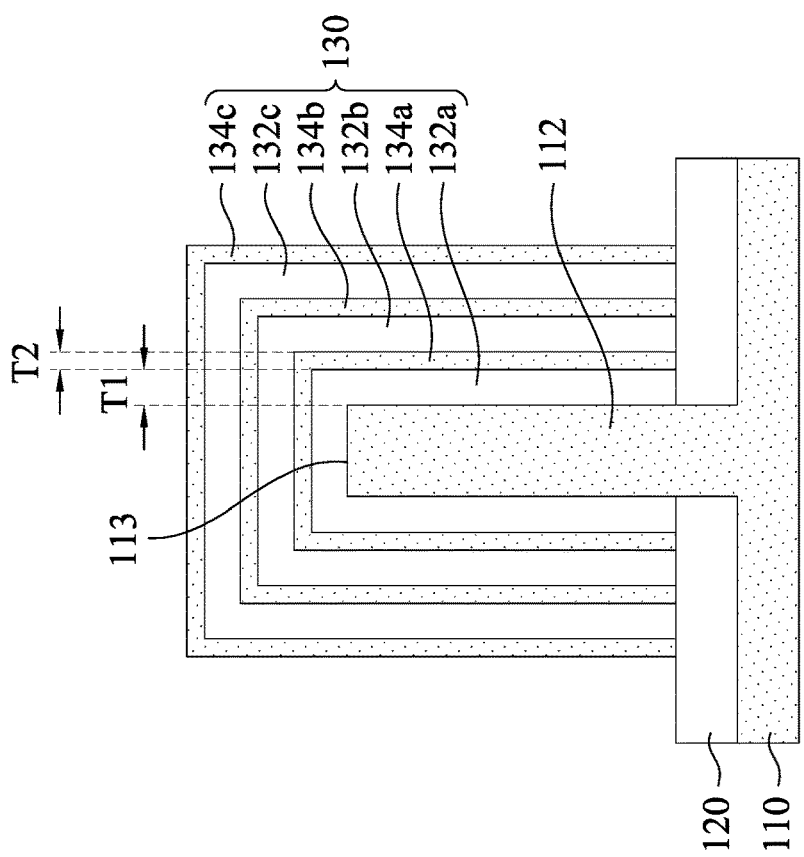
Fig. 2A
Fig. 2B

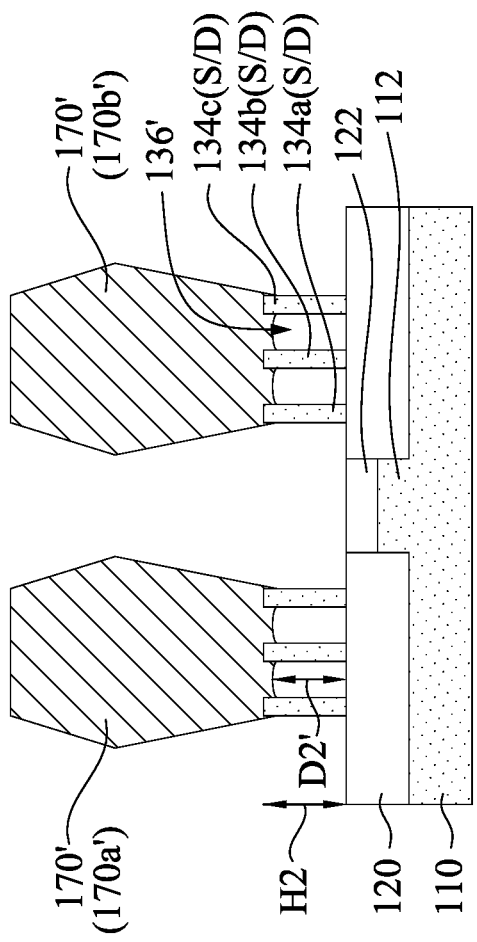
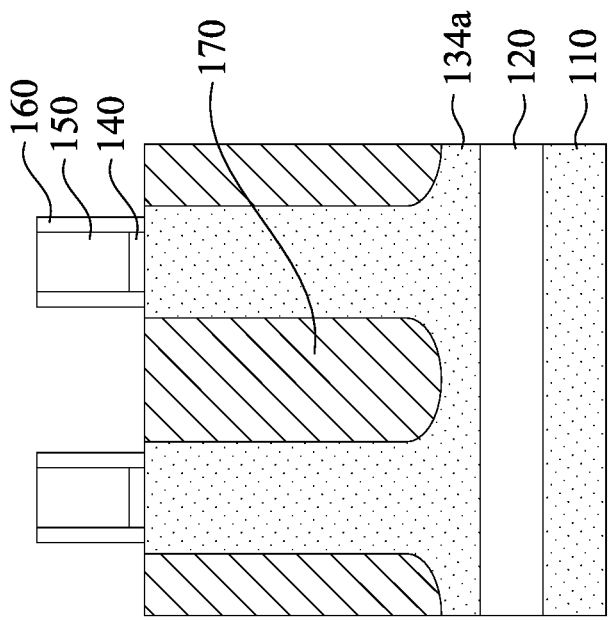
Fig. 9D
Fig. 9C

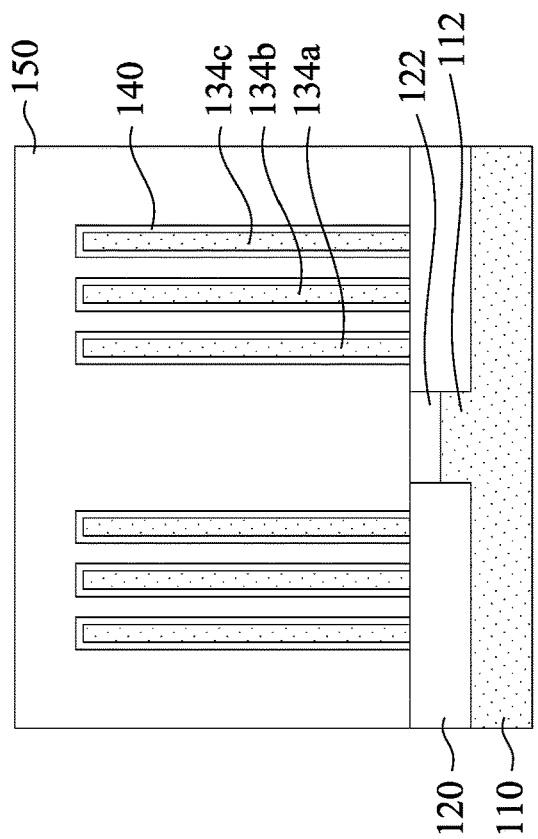
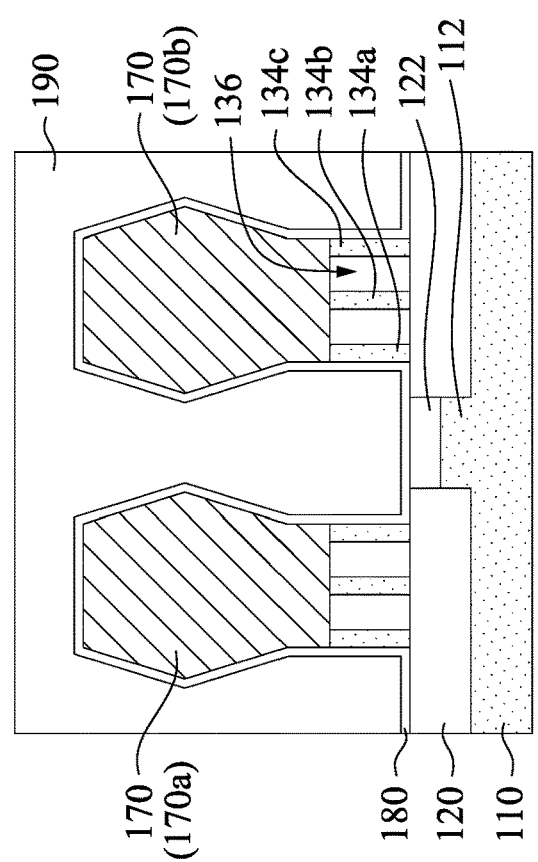
Fig. 10B
Fig. 10A

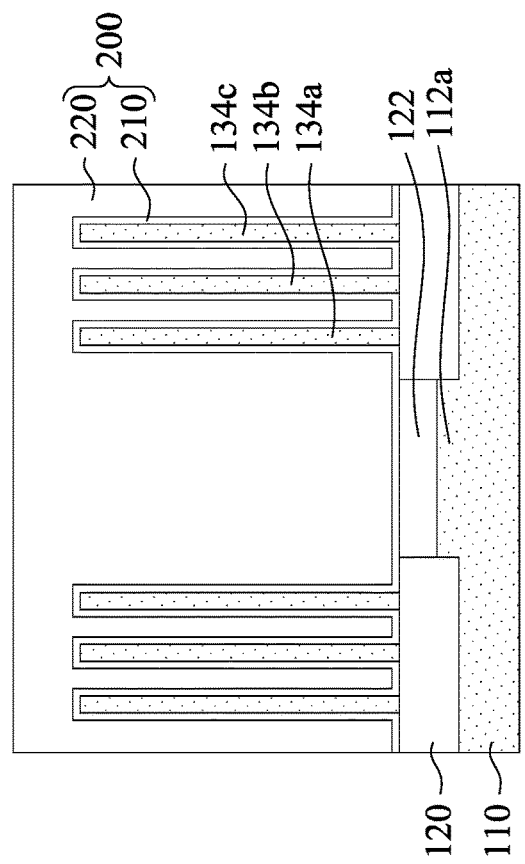
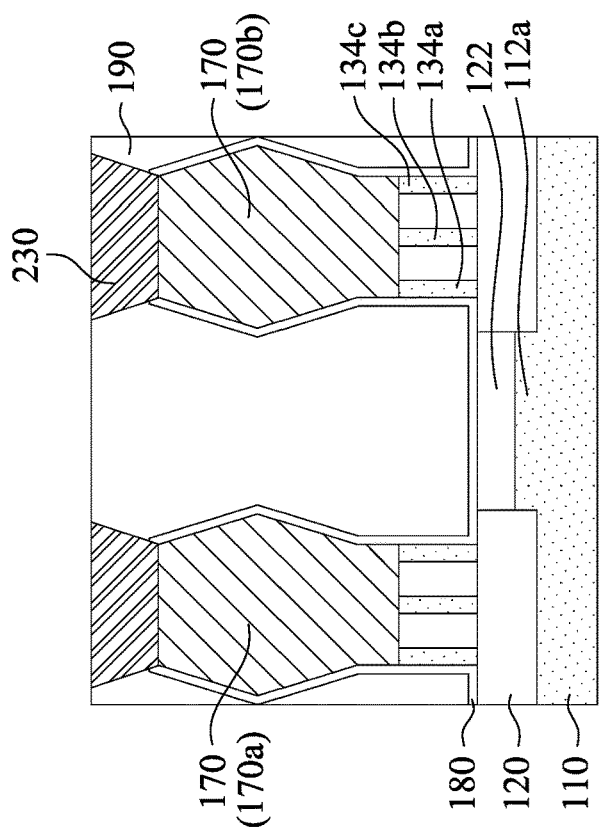
Fig. 17B
Fig. 17A

US 12,057,506 B2

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A to 17C illustrate a method for manufacturing a semiconductor device at various stages in accordance with some embodiments of the present disclosure.

DETAILED DESCRIPTION

Figure 1:
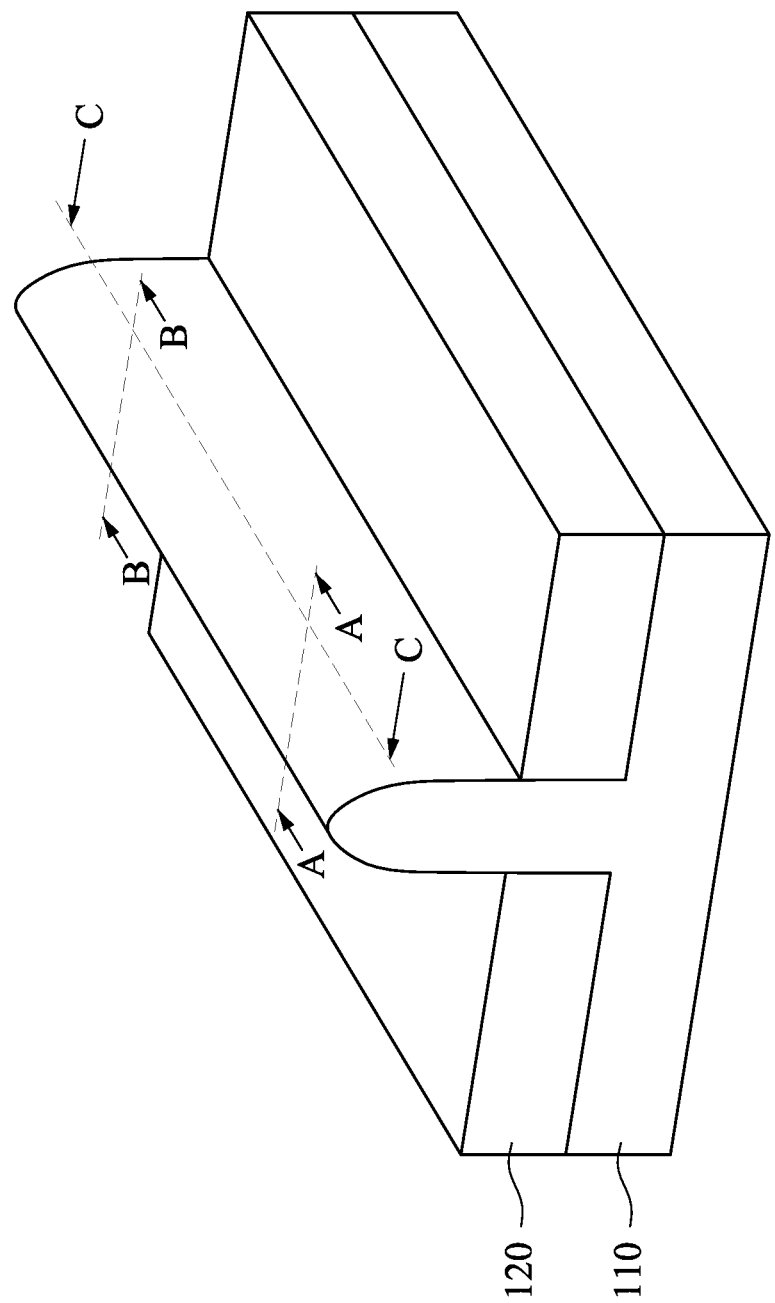
FIGS. 1 to 12C illustrate a method for manufacturing the semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The fins may be patterned by any suitable method. For example, the fins may be patterned using one or more photolithography processes, including double-patterning, or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the tins.

FIGS. 1 to 12C illustrate a method for manufacturing the semiconductor device at various stages in accordance with some embodiments of the present disclosure. FIGS. 2A, 3A, 4A, 5A, 6A, 7A, 8A, 9A, 10A, 11A, and 12A are cross-sectional views of the semiconductor device at various stages taken along line A-A of FIG. 1, FIGS. 2B, 3B, 4B, 5B, 6B, 7B, 8B, 9B, 10B, 11B, and 12B are cross-sectional views of the semiconductor device at various stages taken along line B-B of FIG. 1, and FIGS. 2C, 3C, 4C, 5C, 6C, 7C, 8C, 9C, 10C, 11C, and 12C are cross-sectional views of the semiconductor device at various stages taken along line C-C of FIG. 1. In some embodiments, the semiconductor device shown in FIGS. 1 to 12C may be intermediate devices fabricated during processing of an integrated circuit (IC), or a portion thereof, that may include static random access memory (SRAM), logic circuits, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A semiconductor fin 112 is formed over the substrate 110. The semiconductor fin 112 may be referred as a channel of transistors. It is noted that the number of the semiconductor fin 112 in FIG. 1 is illustrative, and should not limit the claimed scope of the present disclosure. For example, the number of the semiconductor tin 112 is two, three, four, or more than four. In addition, one or more dummy fins may be disposed adjacent both sides of the semiconductor fin 112 to improve pattern fidelity in patterning processes.

The semiconductor fin 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fin in this case) and developed to remove a portion of the photoresist material. The remaining photoresist material protects the underlying material from subsequent processing operations, such as etching. It should be noted that other masks, such as an oxide or silicon nitride mask, may also be used in the etching process. The semiconductor fin 112 may be made of the same material as the substrate 110 and may continuously extend or protrude from the substrate 110. For example, the semiconductor fin 112 and the substrate 110 are made of silicon. The semiconductor fin 112 may be intrinsic, or appropriately doped with an n-type impurity or a p-type impurity. In some other embodiments, the semiconductor fin 112 may be epitaxially grown. For example, exposed portions of an underlying material, such as an exposed portion of the substrate 110, may be used in an epitaxial process to form the semiconductor fin 112. A mask may be used to control the shape of the semiconductor fin 112 during the epitaxial growth process.

After the semiconductor fin 112 is formed, an isolation structure 120, such as shallow trench isolation (STI), is formed over the substrate 110 to separate various devices, so that a top portion of the semiconductor fin 112 is exposed. The semiconductor fin 112 extending from the substrate 110 is in contact with the isolation structure 120. For example, an insulating material layer including one or more layers of insulating material is formed over the substrate 110 so that the semiconductor fin 112 is fully embedded in the insulating material layer. The insulating material for the insulating material layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer, especially when the insulating material layer is formed using flowable CVD. Subsequently, a planarization operation, such as a chemical mechanical polishing (CMP) method or an etch-hack method, is performed such that the top portion of the semiconductor fin 112 is exposed from the insulating material layer. In some embodiments, a liner layer with silicon nitride is formed before forming the insulating material layer. The insulating material layer is then recessed to form the isolation structure 120 so that the top portion of the semiconductor fin 112 is exposed.

Figure 2C:
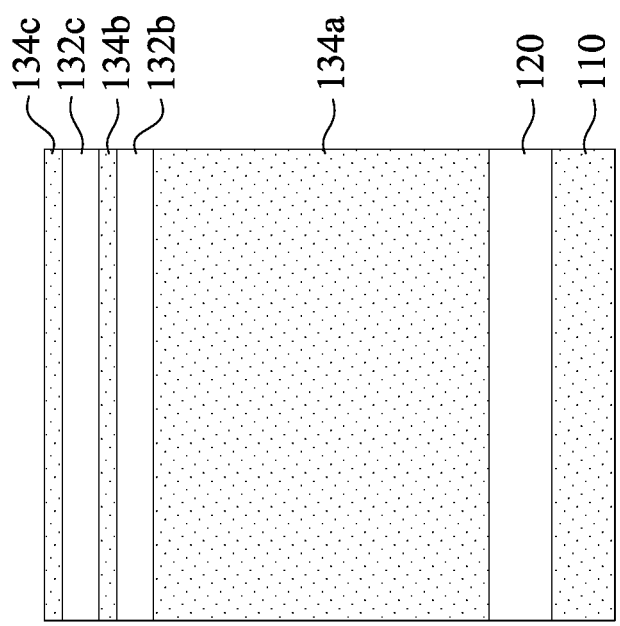

Reference is made to FIGS. 2A, 2B, and 2C. A stacked structure 130 is formed over the isolation structure 120. Specifically, the stacked structure 130 is formed upward from the isolation structure 120 and conformally formed over the semiconductor fin 112. The stacked structure 130 includes first semiconductor layers 132a, 132b, and 132c and second semiconductor layers 134a, 134b, and 134c stacked alternately. Specifically, the first semiconductor layer 132a, the second semiconductor layer 134a, the first semiconductor layer 132b, the second semiconductor layer 134b, the first semiconductor layer 132c, and the second semiconductor layer 134c are formed in sequence lining sidewalls and a top surface 113 of the semiconductor fin 112. The first semiconductor layer 132a of the stacked structure 130 is in contact with the semiconductor fin 112.

In some embodiments, the first semiconductor layers 132a, 132b, and 132c and the second semiconductor layers 134a, 134b, and 134c are made of different materials, and may include one or more layers of Si, Ge, SiGe, GaAs, InSb, GaP, GaSb, InAlAs, InGaAs, GaSbP, GaAsSb or InP. In some embodiments, the second semiconductor layers 134a, 134b, and 134c and semiconductor fin 112 include the same material, such as Si, or a silicon compound. The first semiconductor layers 132a, 132b, and 132c may be made of SiGe, Ge or a Ge compound. In FIGS. 2A, 2B, and 2C, three layers of the first semiconductor layers 132a, 132b, and 132c and three layers of the second semiconductor layers 134a, 134b, and 134c are disposed. However, the numbers of the layers (first semiconductor layers and the second semiconductor layers) are not limited to six, and may be as small as 1 (each layer) and in some embodiments, 2-10 layers of each of the first semiconductor layers and the second semiconductor layers are formed. By adjusting the numbers of the stacked layers, a driving current of the semiconductor device can be adjusted.

In some embodiments, the first semiconductor layers 132a, 132b, and 132c can be SiGe layers having a germanium atomic percentage greater than zero. In some embodiments, the germanium percentage of the first semiconductor layers 132a, 132b, and 132c is in a range from about 10 percent to about 50 percent.

In some embodiments, the second semiconductor layers 134a, 134b, and 134c are pure silicon layers that are free from germanium. The second semiconductor layers 134a, 134b, and 134c may be also substantially pure silicon layers, for example, with a germanium atomic percentage lower than about 1 percent. Furthermore, the second semiconductor layers 134a, 134b, and 134c may be intrinsic, which are not doped with p-type and n-type impurities. In some embodiments, the second semiconductor layers 134a, 134b, and 134c have (110) crystallographic orientations, and the (110) crystallographic orientations are beneficial to achieve better hole mobility.

In some embodiments, the first semiconductor layers 132a, 132b, and 132c have the same thicknesses T1, and the second semiconductor layers 134a, 134b, and 134c have the same thickness T2, in which the thickness T1 is different from the thickness T2. In some embodiments, the thickness T1 of the first semiconductor layer 132a, 132b, and 132c is greater than the thickness T2 of the second semiconductor layers 134a, 134b, and 134c. In some embodiments, the thickness T1 of the first semiconductor layers 132a, 132b, and 132c is in a range from about 8 nm to about 12 nm. For example, the thickness T1 of the first semiconductor layers 132a, 132b, and 132c is about 10 nm. In some embodiments, the thickness T2 of the second semiconductor layers 134a, 134b, and 134c is smaller than 6 nm. For example, the thickness T2 of the second semiconductor layers 134a, 134b, and 134c is in a range from about 4 nm to about 5 nm. As such, the problem of short channel effect caused by drain-induced barrier lowering (DIBL) can be improved. If the thickness T2 of the second semiconductor layers 134a, 134b, and 134c is larger than 6 nm, the problem of short channel effect would occur and thus the performance of the semiconductor device would be adversely affected.

Figure 3A:
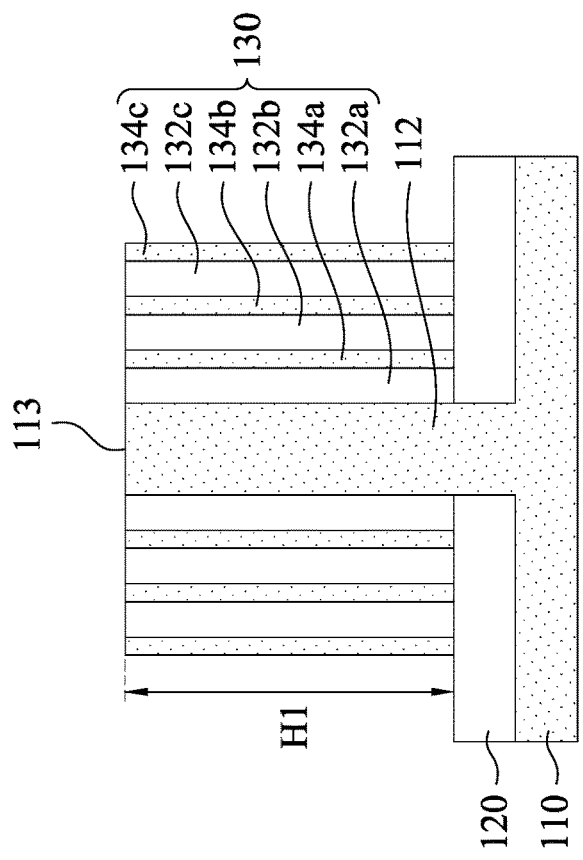
Figure 3B:
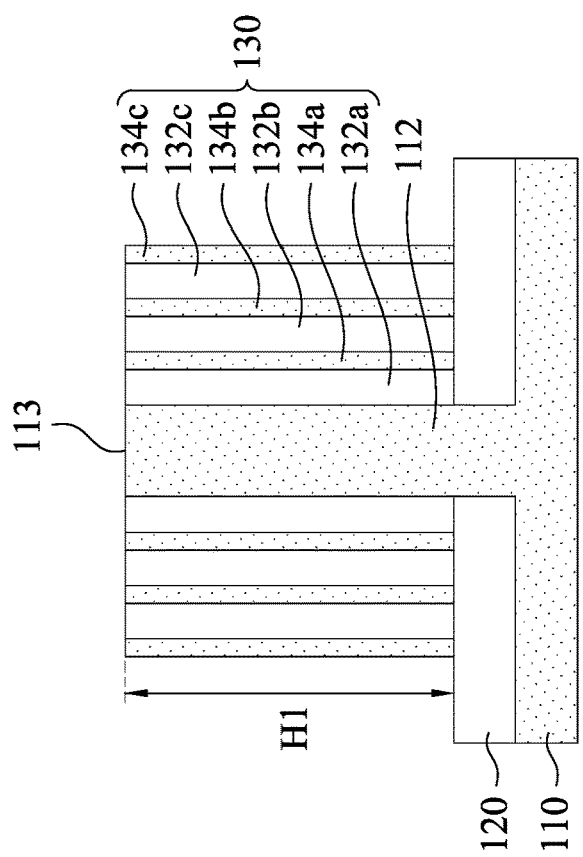
Figure 3C:
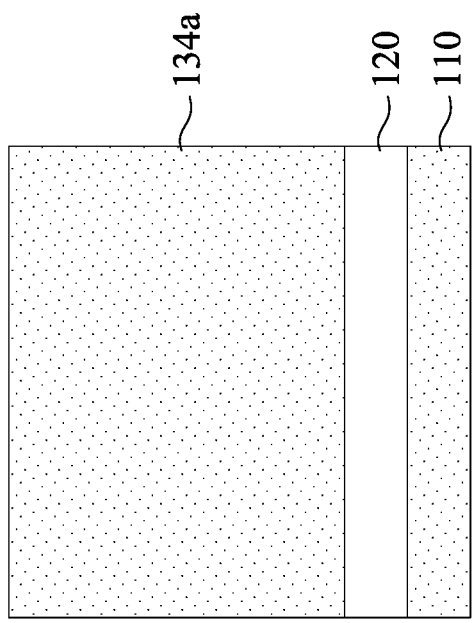
Figure 4A:
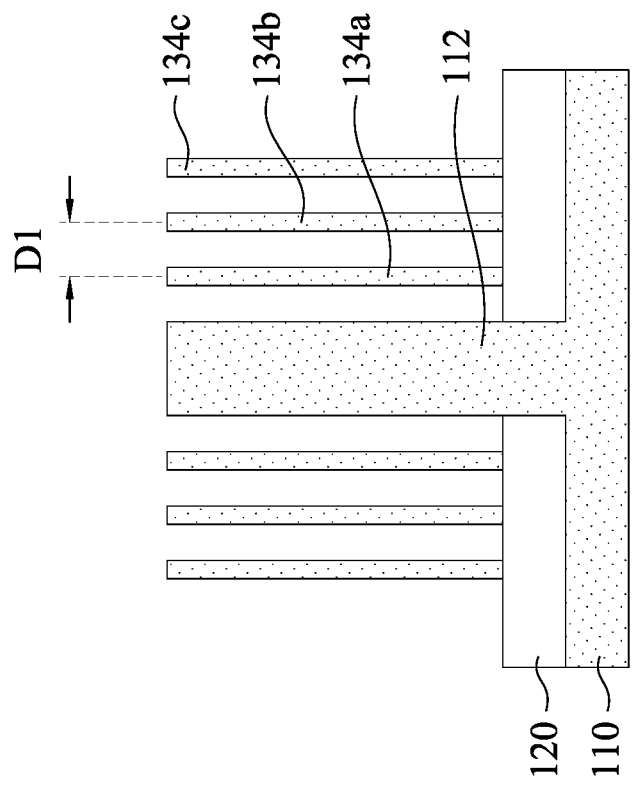
Figure 4B:
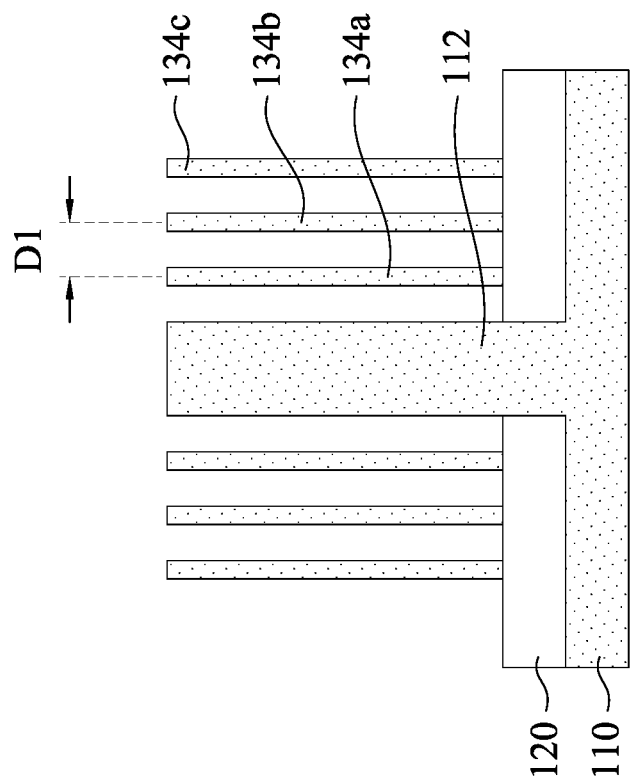
Figure 4C:
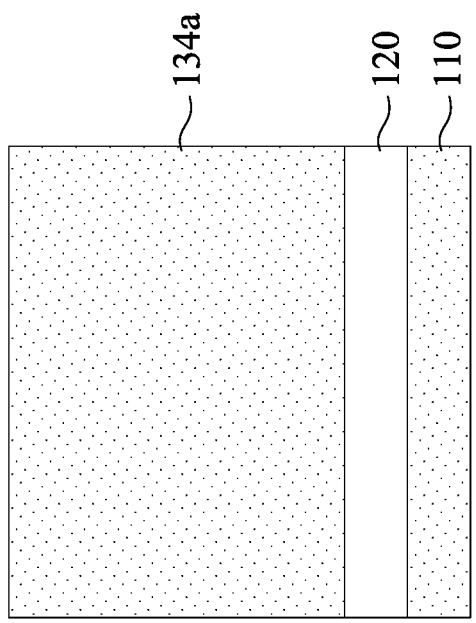

Reference is made to FIGS. 3A, 3B, and 3C. After the stacked structure 130 is formed over the isolation structure 120, an etching process is performed to remove a portion of the stacked structure 130, such that the top surface 113 of the semiconductor fin 112 is exposed. In some embodiments, the stacked structure 130 is etched until the first semiconductor layers 132a, 132b, and 132c and the second semiconductor layers 134a, 134b, and 134c have a height H1. In some embodiments, the height H1 of the first semiconductor layers 132a, 132b, and 132c and the second semiconductor layers 134a, 134b, and 134c is in a range from about 40 nm to 50 nm. For example, the height 111 is about 45 nm. In some embodiments, the first semiconductor layers 132a, 132b, and 132c and the second semiconductor layers 134a, 134b, and 134c are substantially at the same horizontal level.

In some embodiments, the etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like.

Reference is made to FIGS. 3A, 3B, 3C, 4A, 4B, and 4C. An etching process (selective etching process in this case) is performed to remove the first semiconductor layers 132a, 132b, and 132c of the stacked structure 130, thereby forming vertical nanosheets (or nanowires or nanorods or nano-columns) of the second semiconductor layers 134a, 134b, and 134c. Sidewalls of the second semiconductor layers 134a, 134b, and 134c are exposed. The second semiconductor layers 134a, 134b, and 134c are offset from the semiconductor fin in a vertical direction. It is noted that the "vertical direction" herein is referred as a direction perpendicular to a lengthwise direction of the substrate 110, and the "vertical direction" is substantially equal to lengthwise directions of the second semiconductor layers 134a, 134b, and 134c. That is, the second semiconductor layers 134a, 134b, and 134c extend in the vertical direction. The first semiconductor layers 132a, 132b, and 132c can be removed or etched using an etchant that can selectively etch the first semiconductor layers 132a, 132b, and 132c at a faster etching rate than etching the second semiconductor layers 134a, 134b, and 134c.

In some embodiments, each two adjacent second semiconductor layers 134a, 134b, and 134c (e.g., the adjacent second semiconductor layers 134a and 134b) have a pitch D1 therebetween. The pitch D1 is smaller than about 10 nm. For example, the pitch D1 is in a range of about 5 nm to about 10 nm. As such, the lateral dimension of active regions can be reduced and thus the scaling down of the semiconductor device can be achieved.

Figures 12A, 12B:
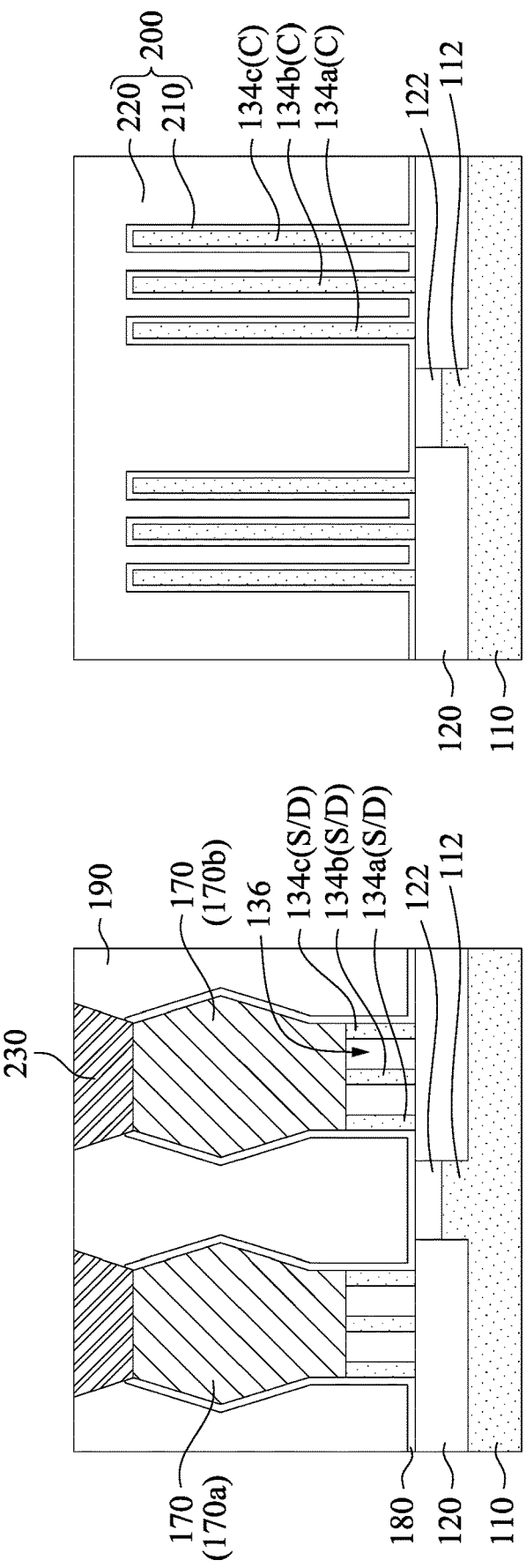
Figure 12C:
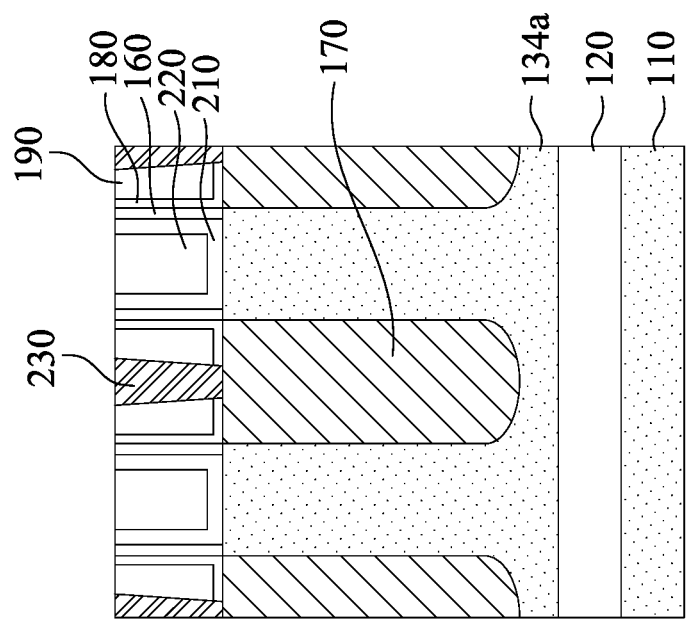

The second semiconductor layers 134a, 134b, and 134c are active regions of the resulting semiconductor device (see FIGS. 12A-12C). In some embodiments, since the second semiconductor layers 134a, 134b, and 134c are in direct contact with the isolation structure 120, the problem of bottom leakage can be avoided or prohibited, thereby improving the performance of the semiconductor device.

Figure 5A:
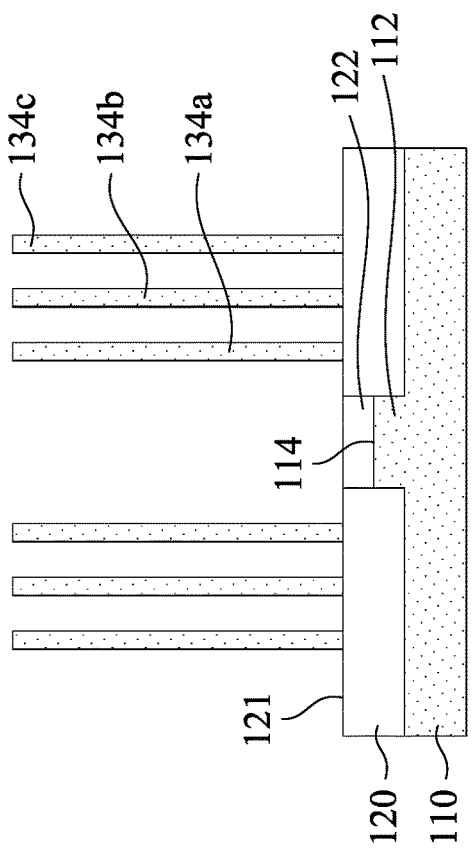
Figure 5B:
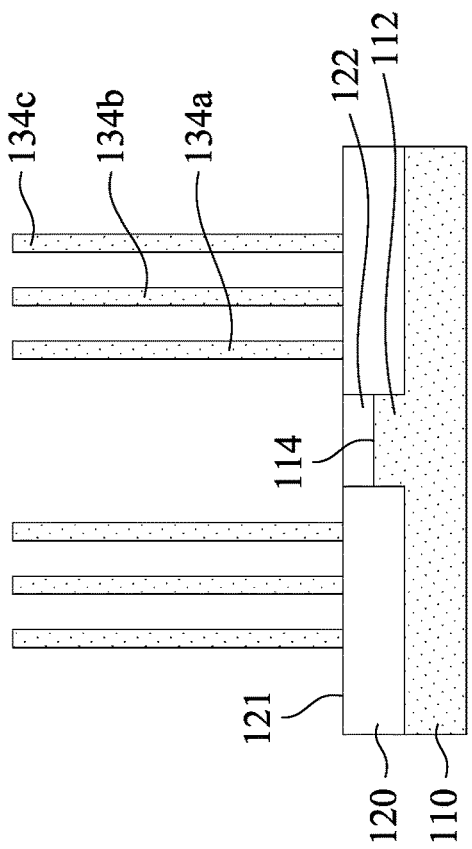
Figure 5C:
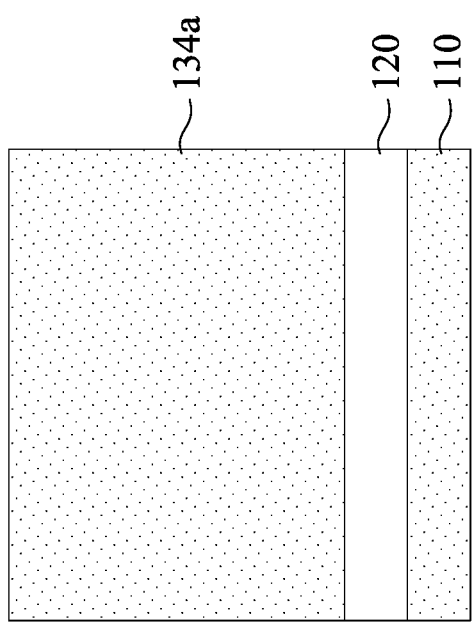

Reference is made to FIGS. 5A, 5B, and 5C. The semiconductor fin 112 over the substrate 110 is partially removed, such that a top surface 114 of the semiconductor fin 112 is below a top surface 121 of the isolation structure 120. In other words, bottom surfaces of the second semiconductor layers 134a, 134b, and 134c are higher than the top surface 114 of the semiconductor fin 112. In some embodiments, a mask layer is formed over the structure of FIGS. 4A-4C. The mask layer covers the second semiconductor layers 134a, 134b, and 134c and exposes the semiconductor fin 112. The mask layer may be removed after the semiconductor fin 112 is partially removed.

Thereafter, an isolation layer 122 is formed over the semiconductor fin 112. In some embodiments, the top surface of the isolation layer 122 is substantially at the same horizontal level as a top surface of the isolation structure 120. In some embodiments, the isolation layer 122 is made of an insulator material such as silicon oxide, silicon nitride, or silicon oxynitride. The isolation layer 122 and the isolation structure 120 may include the same materials. In some embodiments, the isolation layer 122 is formed using chemical vapor deposition (CVD), physical vapor deposition (PVD), atomic layer deposition (ALD), thermal oxide, other suitable processes, or combinations thereof.

Figure 6B:
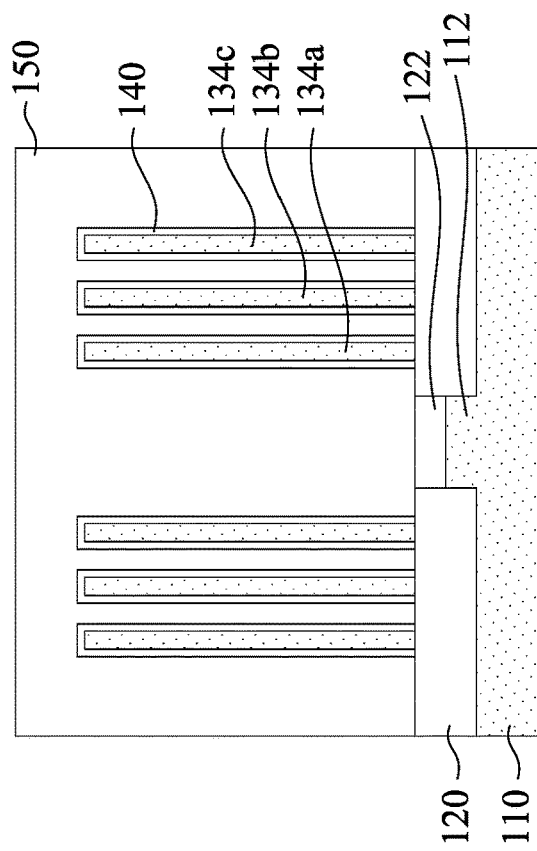
Figure 6A:
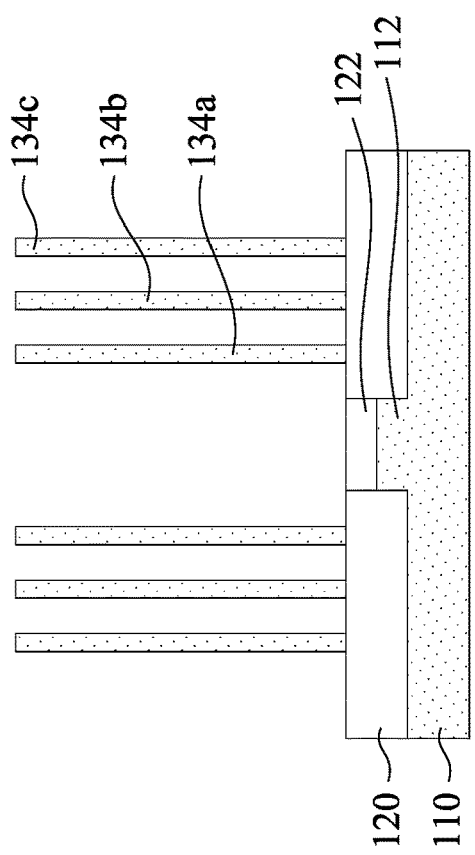
Figure 6C:
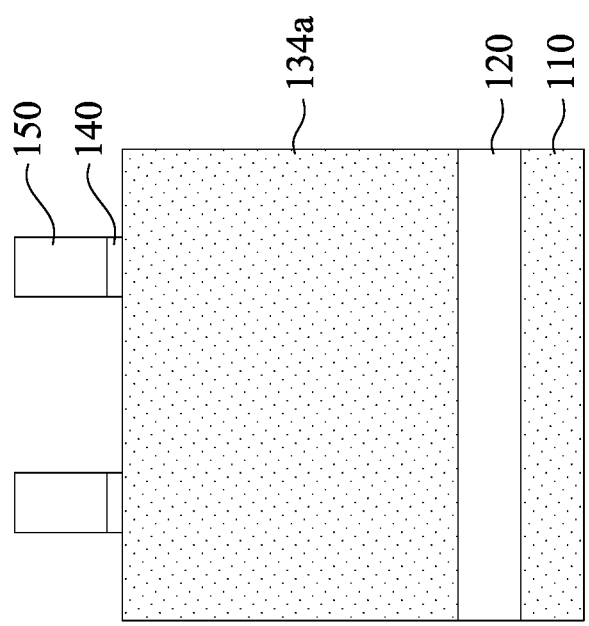

Reference is made to FIGS. 6A, 6B, and 6C. A dummy structure is formed over the second semiconductor layers 134a, 134b, and 134c. The dummy structure includes a dummy dielectric layer 140 and a dummy gate structure 150 over the dummy dielectric layer 140. In some embodiments, a dummy dielectric film and a dummy gate layer (not shown) are formed over the second semiconductor layers 134a, 134b, and 134c, and the dummy dielectric film and the dummy gate layer are patterned to form the dummy dielectric layer 140 and the dummy gate structure 150. The dummy dielectric layer 140 is formed over the isolation structure 120. In other words, the dummy dielectric layer 140 is conformally formed to cover the second semiconductor layers 134a, 134b, and 134c. Specifically, the dummy dielectric layer 140 is in direct contact with top surfaces and sidewalls of the second semiconductor layers 134a, 134b, and 134c. In some embodiments, the dummy dielectric layer 140 may include silicon dioxide, silicon nitride, a high-κ dielectric material, or other suitable material. In various examples, the dummy dielectric film may be deposited by a thermal process, an ALD process, a CVD process, a subatmospheric CVD (SACVD) process, a PVD process, or other suitable process. By way of example, the dummy dielectric layer 140 may be used to prevent damage to the second semiconductor layers 134a, 134b, and 134c by subsequent processing (e.g., subsequent formation of the dummy gate structure).

The dummy gate structure 150 is formed over the dummy dielectric layer 140, the isolation structure 120, and the isolation layer 122. In some embodiments, the dummy gate structure 150 is formed across the second semiconductor layers 134a, 134b, and 134c. In some embodiments, the dummy gate structure 150 may be made of polycrystalline-silicon (poly-Si), poly-crystalline silicon-germanium (poly-SiGe), or other suitable materials.

Figure 7A:
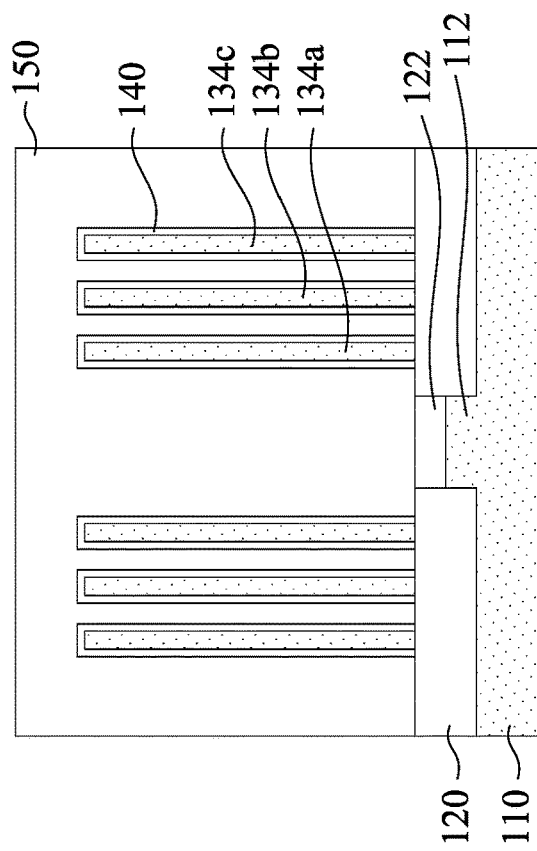
Figure 7B:
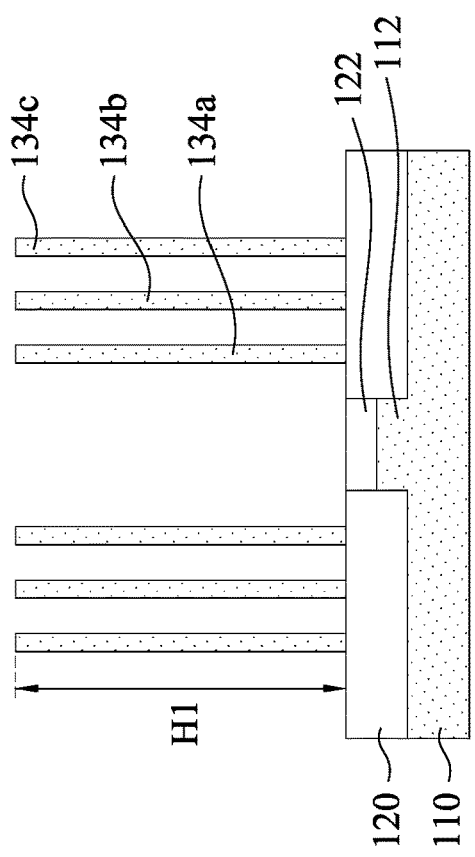
Figure 7C:
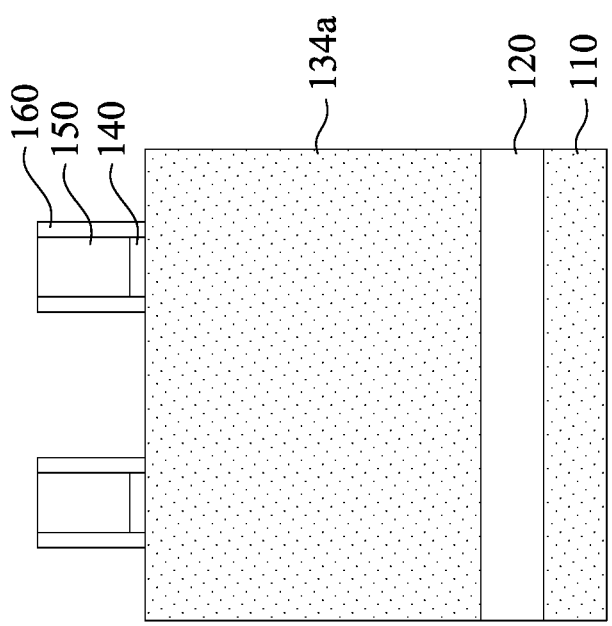

Reference is made to FIGS. 7A, 7B, and 7C. A spacer structure 160 is at least formed on opposite sides of the dummy dielectric layer 140 and the dummy gate structure 150. The spacer structure 160 is in contact with the second semiconductor layers 134a, 134b, and 134c, the dummy dielectric layer 140 and the dummy gate structure 150. The spacer structure 160 may include a seal spacer and a main spacer (not shown). The spacer structure 160 includes one or more dielectric materials, such as silicon oxide, silicon nitride, silicon oxynitride, SiCN, SiCxOyNz, or combinations thereof. The seal spacer is formed on sidewalls of the dummy dielectric layer 140 and the dummy gate structure 150 and the main spacer is formed on the seal spacers. The spacer structure 160 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structure 160 may include blanket forming spacer layer and then performing etching operations to remove the horizontal portions of the spacer layer. The remaining vertical portions of the spacer layer form the spacer structure 160.

Figure 8B:
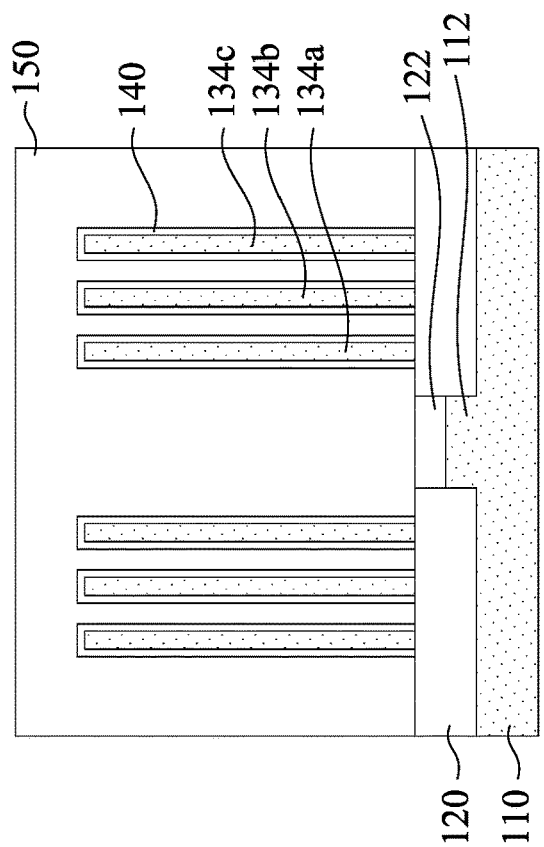
Figure 8A:
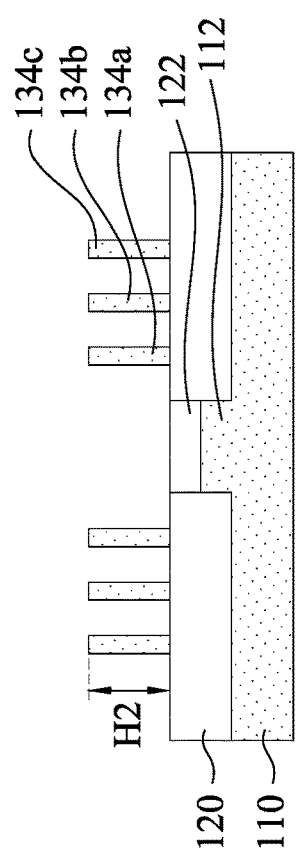
Figure 8C:
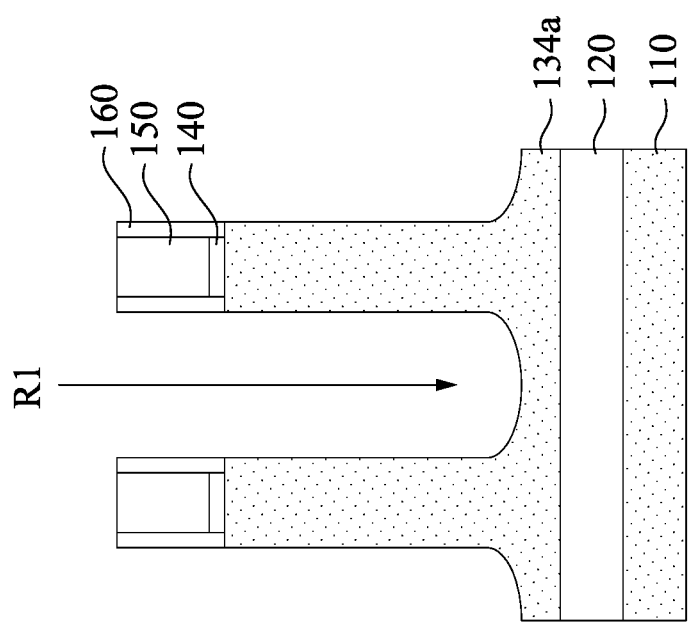

Reference is made to FIGS. 8A, 8B, and 8C. Portions of the second semiconductor layers 134a, 134b, and 134c are removed by using an etching process, for example, a strained source/drain (SSD) etching process. The etching process may be performed in a variety of ways. In some embodiments, the etching process may be performed by a dry chemical etch with a plasma source and a reaction gas. The plasma source may be an inductively coupled plasma (ICR) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the etching process may be performed by a wet chemical etch, such as ammonium peroxide mixture (APM), $NH_4OH$, TMAH, combinations thereof, or the like. In yet some other embodiments, the etching process may be performed by a combination of a dry chemical etch and a wet chemical etch.

In some embodiments, portions of the second semiconductor layers 134a, 134b, and 134c are removed while the other portions of the second semiconductor layers 134a, 134b, and 134c are remained, such that recesses RI are formed in the second semiconductor layers 134a, 134b, and 134c. In some embodiments, the second semiconductor layers 134a, 134b, and 134c are recessed (etched), such that a height H2 is substantially smaller than the height H1 (see FIGS. 7A, 7B, and 7C). In some embodiments, the height H2 is in a range from about 8 nm to 12 nm, and the height H1 (see FIGS. 7A, 7B, and 7C) is in a range from about 40 nm to 50 nm. For example, the height H2 is about 10 nm, and the height H1 is about 45 nm.

Figure 9B:
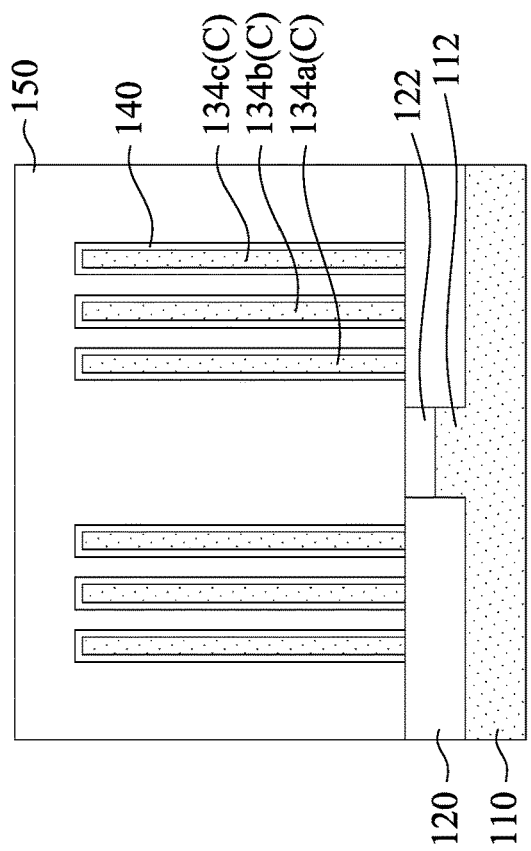
Figure 9A:
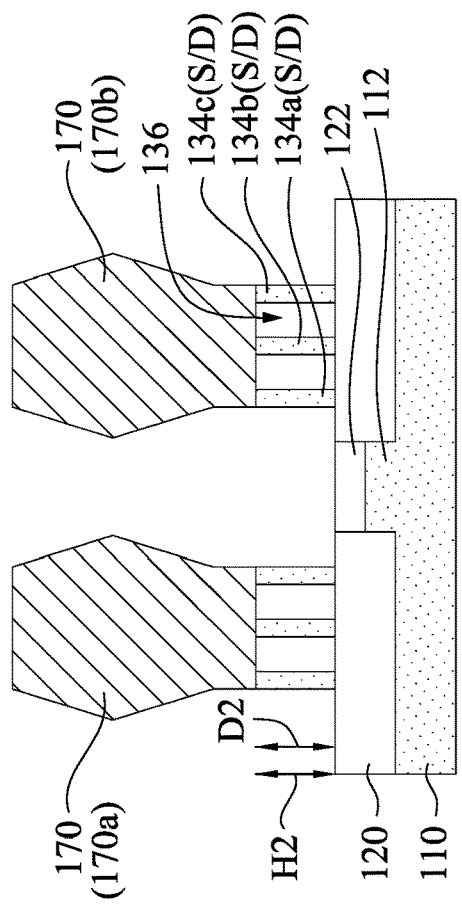

Reference is made to FIGS. 9A, 9B, and 9C. Epitaxial structures 170 are formed over the second semiconductor layers 134a, 134b, and 134c by performing, for example, a selectively growing process. The epitaxial structures 170 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxial structures 170 have suitable crystallographic orientations (e.g., (110) and (111) crystallographic orientations), such that the epitaxial structures 170 have hexagon cross sections.

In some embodiments, the epitaxial structures 170 are source/drain (S/D) epitaxial structures. Each of the epitaxial structures 170 includes one or more layers of Si, SiP, SiC and SiCP for an n-channel FET or Si, SiGe, Ge for a p-channel FET. The epitaxial structures 170 are formed by an epitaxial growth method using CVD, ALD or molecular beam epitaxy (MBE), In some embodiments as depicted in FIG. 9A, the epitaxial structures 170 on opposite sides of the semiconductor fin 112 (e.g., the epitaxial structures 170a and 170b) do not merged. In some embodiments, the epitaxial structures 170 are over source/drain portions S/D of the second semiconductor layers 134a, 134b, and 134c, while the dummy gate structure 150 is over channel portions C of the second semiconductor layers 134a, 134b, and 134c. In some embodiments, air gaps 136 are formed under the epitaxial structures 170 and between the source/drain portions S/D of the adjacent second semiconductor layers 134a and 134b and/or between the source/drain portions S/D of the adjacent second semiconductor layers 134b and 134c. In some embodiments, the height 112 of the source/drain portion S/D of the second semiconductor layers 134a, 134b, and 134c are substantially the same as a depth D2 of the air gaps 136. Specifically, the air gaps 136 have top surfaces adjacent the epitaxial structures 170 and bottom surfaces adjacent the isolation structure 120, in which the top surfaces of the air gap 136 are substantially coplanar with top surfaces of the source/drain portion S/D of the second semiconductor layers 134a, 134b, and 134c, and the bottom surfaces of the air gap 136 are substantially coplanar with bottom surfaces of the source/drain portion S/D of the second semiconductor layers 134a, 134b, and 134c. In some embodiments, the epitaxial structures 170a and 170b have different conductivity types. For example, the epitaxial structure 170a is an N-type epitaxial structure, and the epitaxial structure 170b is a P-type epitaxial structure, or vice versa.

In some embodiments, a ratio of the height H1 (see FIG. 7A) to the depth D2 is in a range from about 3 to about 5. For example, the ratio of the height H1 (see FIG. 7A) to the depth D2 is about 4.5. As such, the electricity (e.g., alternating current and direct current) can be balanced and thus the performance of the semiconductor device can be improved. If the ratio of the height H1 (see FIG. 7A) to the depth D2 is larger than 5, the forming of epitaxial structures 170 would be adversely affected and the capacitance would be increased, thereby decreasing electricity (e.g., alternating current would be adversely affected). If the ratio of the height H1 (see FIG. 7A) to the depth D2 is larger than 3, the height of second semiconductor layers 134a, 134b, and 134c may not be aligned with the height of epitaxial structures 170, thereby decreasing electricity (e.g., direct current would be adversely affected).

FIG. 9D illustrates a semiconductor device at one stage in accordance with some embodiments of the present disclosure. In FIG. 9D, epitaxial structures 170' are formed over the second semiconductor layers 134a, 134b, and 134c, The epitaxial structures 170' (epitaxial structures 170a' and 170b') surrounds each top portions of the second semiconductor layers 134a, 134b, and 134c. In other words, an upper portion of an air gap 136' is partially filled with the epitaxial structures 170' such that a depth D2' of the air gap 136' is smaller than the height H2 of the source/drain portion S/D of the second semiconductor layers 134a, 134b, and 134c.

Figure 10C:
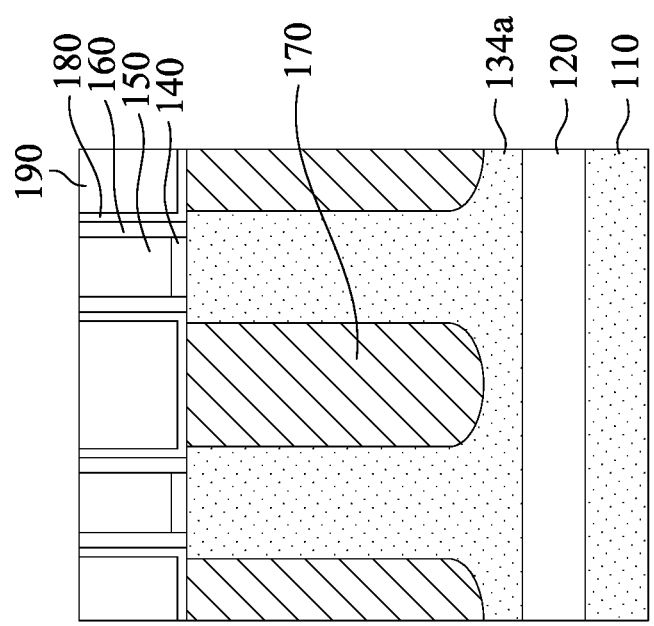

Reference is made to FIGS. 10A, 10B, and 10C. A contact etch stop layer (CESL) 180 is conformally formed over the epitaxial structures 170, the dummy gate structure 150, the spacer structure 160, the isolation structure 120, and the isolation layer 122. In some embodiments, the CESL 180 can be a stressed layer or layers. In some embodiments, the CESL 180 has a tensile stress and is formed of $Si_3N_4$. In some other embodiments, the CESL 180 includes materials such as oxynitrides. In yet some other embodiments, the CESL 180 may have a composite structure including a plurality of layers, such as a silicon nitride layer overlying a silicon oxide layer. The CESL 180 can be formed using plasma enhanced CVD (PECVD), however, other suitable methods, such as low pressure CVD (LPCVD), atomic layer deposition (ALD), and the like, can also be used.

After the CESL 180 is formed, an interlayer dielectric (ILD) 190 is then formed on the CESL 180. The ILD 190 may be formed by chemical vapor deposition (CVD), high-density plasma CVD, spin-on, sputtering, or other suitable methods. In some embodiments, the ILD 190 includes silicon oxide. In some other embodiments, the ILD 190 may include silicon oxy-nitride, silicon nitride, compounds including Si, O, C and/or H (e.g., silicon oxide, SiCOH and SiOC), a low-k material, or organic materials (e.g., polymers). Then, a planarization process, such as a chemical mechanical planarization (CMP) process, is performed to planarize the CESL 180 and the ILD 190 to expose the dummy gate structure 150.

Figure 11B:
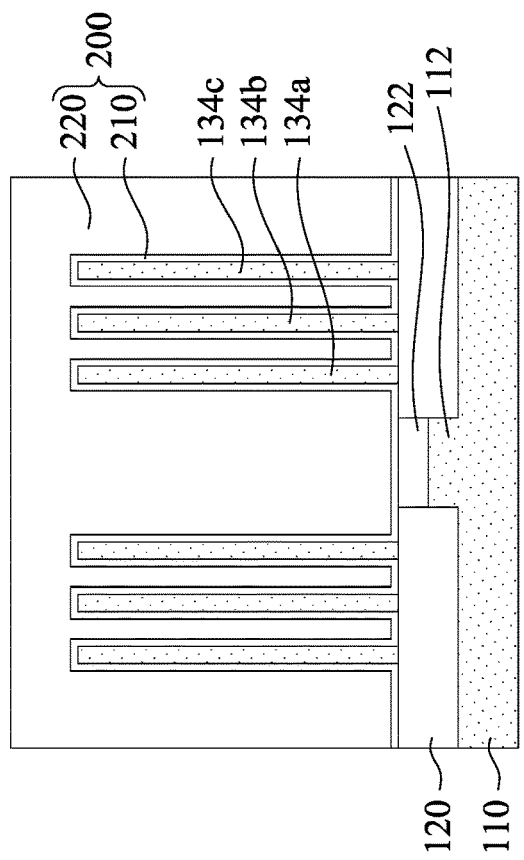
Figure 11A:
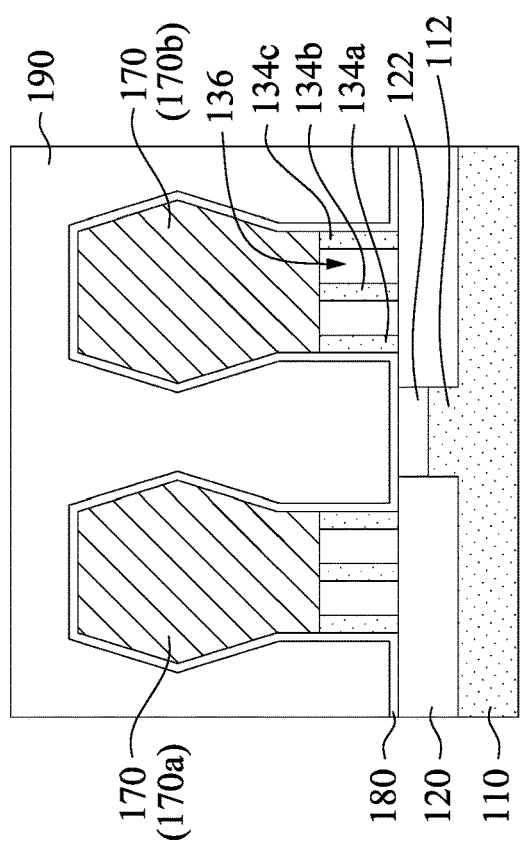
Figure 11C:
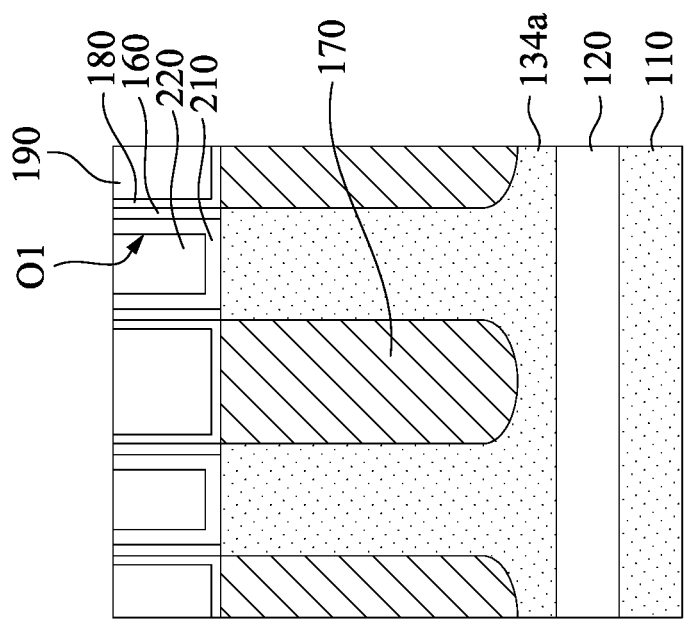

Reference is made to FIGS. 11A, 11B, and 11C. A replacement gate (RPG) process scheme is employed. In the RPG process scheme, a dummy polysilicon gate (the dummy gate structure 150 (see FIGS. 10B and 10C) in this case) is formed in advance and is replaced later by a metal gate. In some embodiments, the dummy gate structure 150 is removed to form an opening O1 with the spacer structure 160 as its sidewalls. In some other embodiments, the dummy dielectric layer 140 (see FIGS. 10B and 10C) is removed as well. The dummy dielectric layer 140 and the dummy gate structure 150 may be removed by dry etch, wet etch, or a combination of dry and wet etch.

A gate dielectric layer 210 is conformally formed in the opening O1. The gate dielectric layer 210 is formed over the second semiconductor layers 134a, 134b, and 134c. Specifically, the gate dielectric layer 210 surrounds the second semiconductor layers 134a, 134b, and 134c, such that top surfaces and opposite sidewalls of the second semiconductor layers 134a, 134b, and 134c are direct in contact with the gate dielectric layer 210. The gate dielectric layer 210 is formed on a sidewall of the spacer structure 160. The gate dielectric layer 210 can be a high-κ dielectric layer having a dielectric constant (κ) higher than the dielectric constant of $SiO_2$, i.e. κ>3.9. The gate dielectric layer 210 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, or other suitable materials. The gate dielectric layer 210 is deposited by suitable techniques, such as ALD, CVD, PVD, thermal oxidation, combinations thereof, or other suitable techniques.

At least one metal layer is formed in the opening O1 and on the gate dielectric layer 210. Subsequently, a chemical mechanical planarization (CMP) process is performed to planarize the metal layer and the gate dielectric layer 210 to form metal gate structure 200 in the opening O1. The metal gate structure 200 crosses over the second semiconductor layers 134a, 134b, and 134c. The metal gate structure 200 includes the gate dielectric layer 210 and a metal gate electrode 220 over the gate dielectric layer 210. The metal gate electrode 220 may include work function metal layer(s), capping layer(s), fill layer(s), and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal gate structure 200 (the gate dielectric layer 210 and the metal gate electrode 220) covers the second semiconductor layers 134a, 134b, and 134c. Specifically, a top surface of the metal gate structure 200 is higher than top surfaces of the second semiconductor layers 134a, 134b, and 134c. In some embodiments, a bottom surface of the metal gate structure 200 and bottom surfaces of the second semiconductor layers 134a, 134b, and 134c are substantially coplanar.

In some embodiments, the metal gate electrode 220 is a p-type metal gate including a p-type work function metal layer. In some embodiments, the capping layer in the metal gate electrodes 220 may include refractory metals and their nitrides (e.g. TiN, TaN, $W_2N$, TiSiN, TaSiN). In other embodiments, the capping layer in the metal gate electrodes 220 is made of WC. The capping layer may be deposited by PVD, CVD, metal-organic chemical vapor deposition (MOCVD) ALD, or the like. In some embodiments, the fill layer in the metal gate electrodes 220 may include tungsten (W). The fill layer may be deposited by ALD, CVD, or other suitable process.

Reference is made to FIGS. 12A, 12B, and 12C. After the metal gate structure 200 is formed, the ILD 190 is then patterned to form trenches on opposite sides of the metal gate structure 200, and then the CESL 180 is patterned to expose the epitaxial structures 170. In some embodiments, multiple etching processes are performed to pattern the ILD 190 and the CESL 180. The etching processes include dry etching process, wet etching process, or combinations thereof.

Thereafter, contacts 230 are formed in the trenches and respectively over the epitaxial structures 170. As such, the contacts 230 are electrically connected to the epitaxial structures 170. In some embodiments, the contacts 230 may be made of metal, such as W, Co, Ru, Al, Cu, or other suitable materials. After the deposition of the contact 230, a planarization process, such as a chemical mechanical planarization (CMP) process, may be then performed. In some embodiments, barrier layers may be formed in the trenches before the formation of the contact 230. The barrier layers may be made of TiN, TaN, or combinations thereof. In still some embodiments, metal alloy layers are formed over the epitaxial structures 170 prior to forming the barrier layers and the contacts 230. The metal alloy layers may be silicide if the epitaxial structures 170 are made of silicon.

In some embodiments, the semiconductor device in FIGS. 12A-12C includes the substrate 110, the semiconductor fin 112, the isolation structure 120, the second semiconductor layers 134a, 134b, and 134c, and the gate structure 200. The semiconductor fin 112 extends from the substrate 110. The isolation structure 120 is over the substrate 110 and adjacent to the semiconductor fin 112. That is, the isolation structure 120 is in direct contact with the semiconductor fin 112. A top surface 114 of the semiconductor fin 112 is lower than a top surface 121 of the isolation structure 120. The second semiconductor layers 134a, 134b, and 134c are on the isolation structure 120. For example, bottom surfaces 135 of the second semiconductor layers 134a, 134b, and 134c are in contact with the top surface 121 of the isolation structure 120. Also, the bottom surfaces 135 of the second semiconductor layers 134a, 134b, and 134c are higher than a top surface of the semiconductor fin 112. Further, the second semiconductor layers 134a, 134b, and 134c are separated from the substrate 110 by the isolation structure 120.

In some embodiments, the second semiconductor layers 134a, 134b, and 134c have the channel portions C and the source/drain portions S/D. The height of the channel portion C of the second semiconductor layers 134a, 134b, and 134c is in a range from 40 nm to 50 nm. In some embodiments, the second semiconductor layers 134a, 134b, and 134c and the semiconductor tin 112 (and the substrate 110) are made of substantially the same material (e.g., silicon in this case). In some embodiments, a width W1 of each of the second semiconductor layers 134a, 134b, and 134c is less than a width W2 of the semiconductor fin 112. A height H1 of each of the second semiconductor layers 134a, 134b, and 134c is greater than a height H3 of the semiconductor fin 112.

The gate structure 200 is over the channel portion C of the second semiconductor layers 134a, 134b, and 134c. In some embodiments, the second semiconductor layers 134a, 134b, and 134c is in contact with the second semiconductor layers 134a, 134b, and 134c and spaced apart from the semiconductor fin 112. A bottom surface 201 of the gate structure 200 is substantially coplanar with the bottom surfaces 135 of the second semiconductor layers 134a, 134b, and 134c.

In some embodiments, the semiconductor device further includes the epitaxial structures 170 over the source/drain portions S/D of the second semiconductor layers 134a, 134b, and 134c. The air gap 136 is defined by the epitaxial structures 170, the source/drain portions S/D of the second semiconductor layers 134b and 134c (or the second semiconductor layers 134a and 134b in some cases), and the isolation structure 120.

In some embodiments, the semiconductor device further includes the isolation layer 122 over the semiconductor fin 112. That is, the isolation layer 122 is in contact with the semiconductor fin 112 and the isolation structure 120. A top surface 123 of the isolation layer 122 may be higher than, coplanar with, or lower than the top surface 121 of the isolation structure 120. The isolation layer 122 is spaced apart from the second semiconductor layers 134a, 134b, and 134c. A bottom surface of the isolation layer 122 (i.e., the top surface 114 of the semiconductor fin 112) is lower than the bottom surface 135 of the second semiconductor layers 134a, 134b, and 134c.

FIGS. 13A to 17C illustrate a method for manufacturing a semiconductor device at various stages in accordance with some embodiments of the present disclosure. It noted that FIGS. 13A, 14A, 15A, 16A, and 17A are cross-sectional views of the semiconductor device at various stages taken along (the same direction of) line A-A of FIG. 1, FIGS. 13B, 14B, 15B, 16B, and 17B are cross-sectional views of the semiconductor device at various stages taken along (the same direction of) line B-B of FIG. 1, and FIGS. 13C, 14C, 15C, 16C, and 17C are cross-sectional views of the semiconductor device at various stages taken along (the same direction of) line C-C of FIG. 1. In some embodiments, the semiconductor device shown in FIGS. 13A to 17C may be intermediate devices fabricated during processing of an integrated circuit (IC), or a portion thereof, that may include static random access memory (SRAM), logic circuits, passive components and/or active components, such as p-type field effect transistors (PFETs), n-type FETs (NFETs), multigate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 13B:
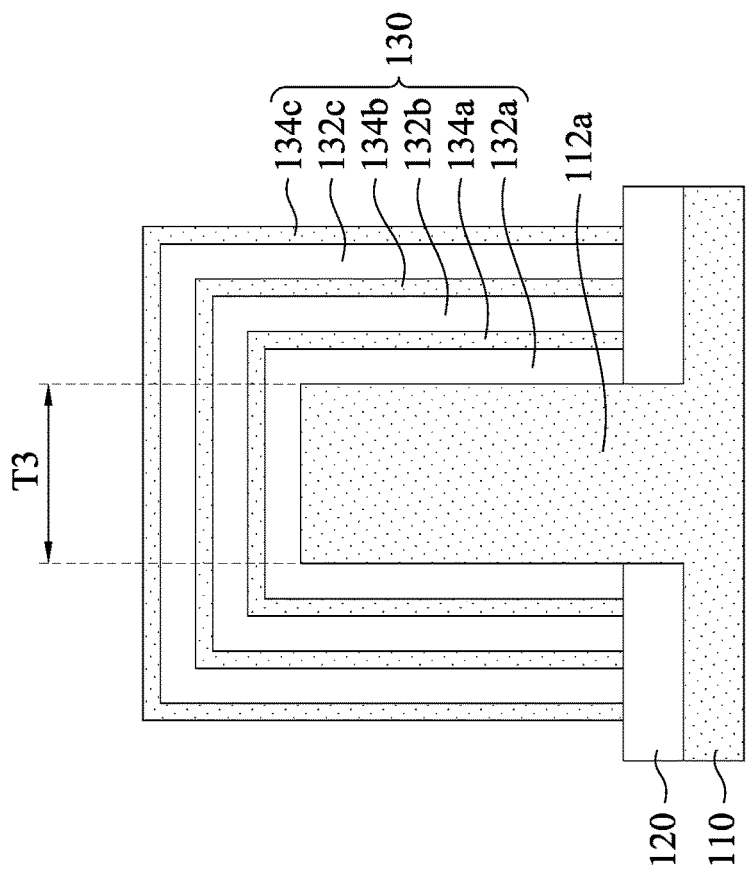
Figure 13A:
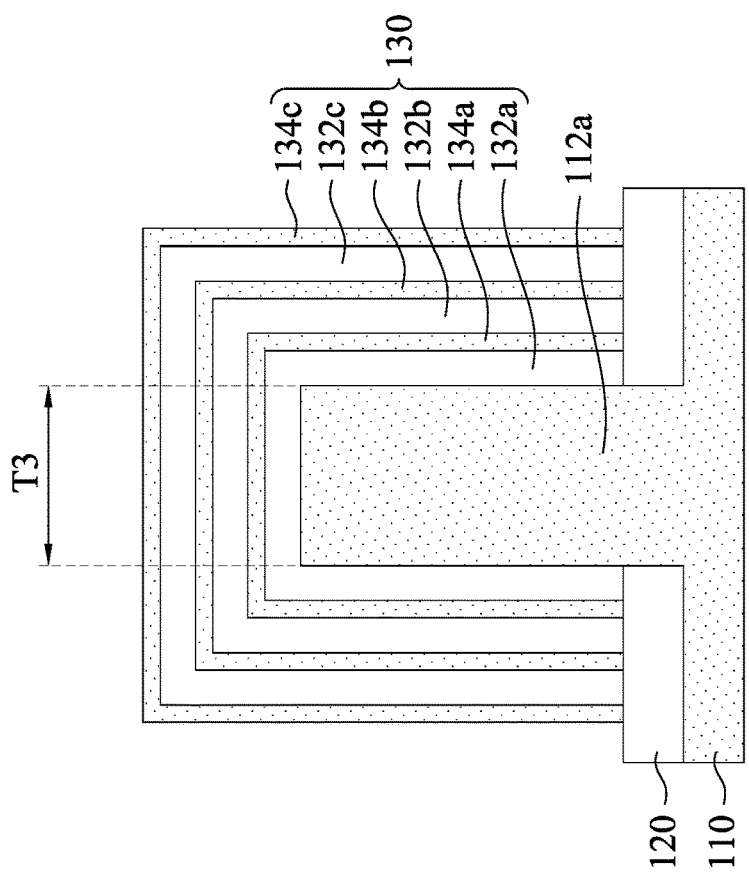
Figure 13C:
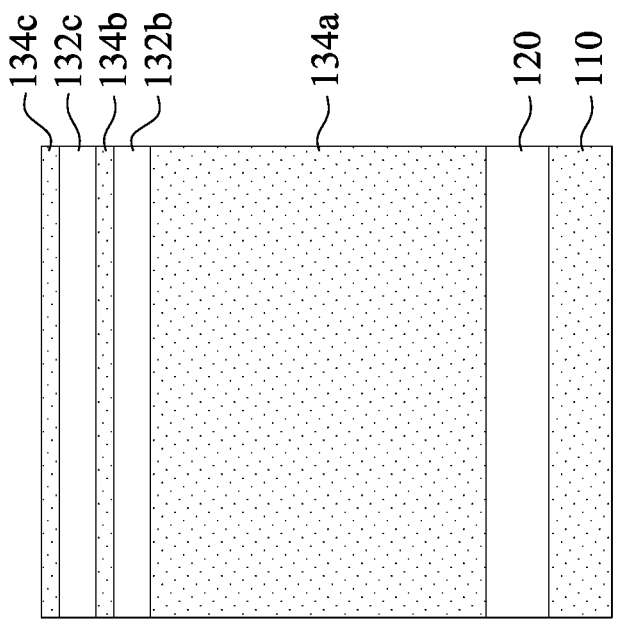

Reference is made to FIGS. 13A, 13B, and 13C. A semiconductor fin 112a is formed over the substrate 110. Materials, configurations, dimensions, processes and/or operations regarding the substrate 110 are similar to or the same as the substrate 110 of 2A, 2B, and 2C, In some embodiments, the semiconductor fin 112a has a thickness T3 in a range from about 20 nm to 30 nm. As such, not only the uniformity but also the shape (e.g., rectangular shape) of the semiconductor fin 112a can be achieved. For example, the thickness T3 of the semiconductor fin 112a is about 27 nm. If the thickness T3 of the semiconductor fin 112a is smaller than 20 nm, the semiconductor fin 112a may not provide enough supporting force to support the element (e.g., the stacked structure 130) above the semiconductor fin 112a, thereby adversely affecting the performance of the semiconductor device.

The isolation structure 120 is formed over the substrate 110, and the stacked structure 130 is then formed over the isolation structure 120. The stacked structure 130 includes the first semiconductor layers 132a, 132b, and 132c and the second semiconductor layers 134a, 134b, and 134c stacked alternately. Materials, configurations, dimensions, processes and/or operations regarding the isolation structure 120 and the stacked structure 130 are similar to or the same as the isolation structure 120 and the stacked structure 130 of FIGS. 2A, 2B, and 2C.

Figure 14B:
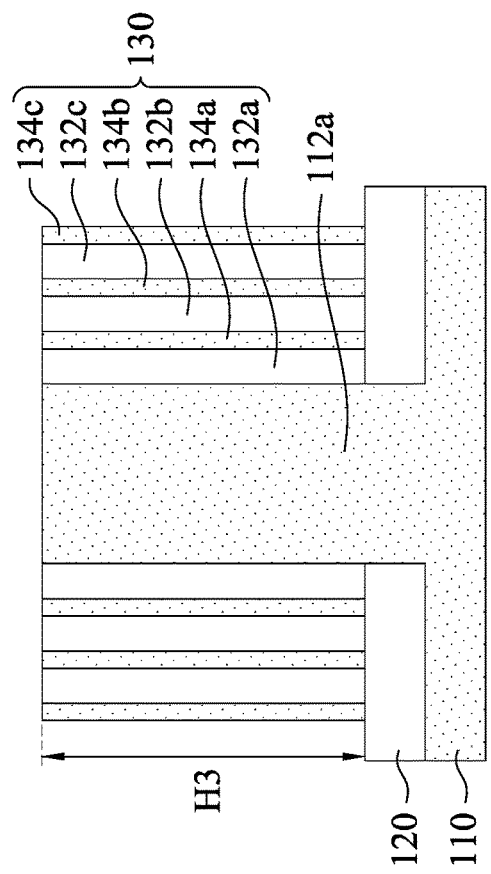
Figure 14A:
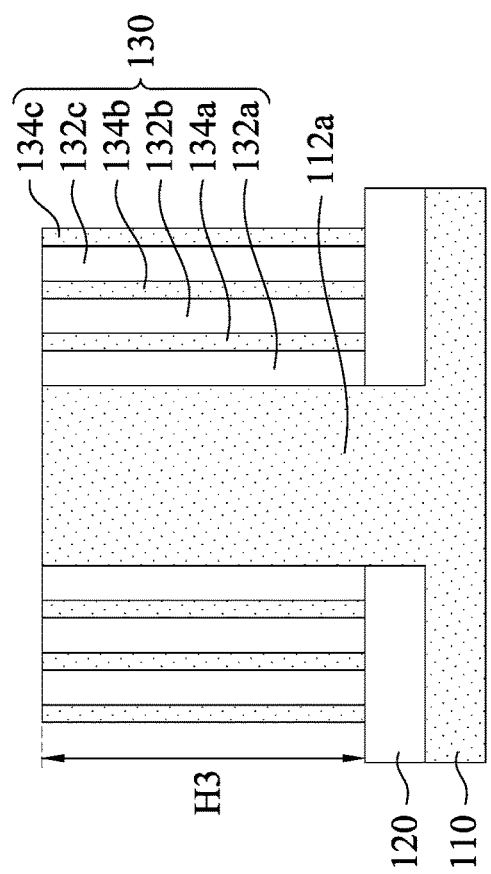
Figure 14C:
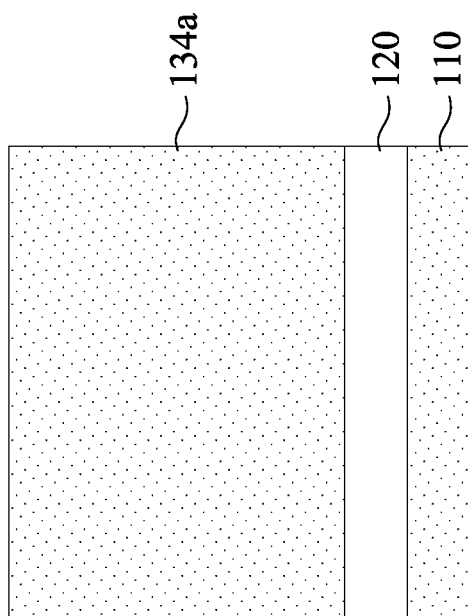

Reference is made to FIGS. 14A, 14B, and 14C. After the stacked structure 130 is formed over the isolation structure 120, an etching process is performed to remove a portion of the stacked structure 130, such that a top surface of the semiconductor fin 112a is exposed. In some embodiments, the stacked structure 130 is etched until the first semiconductor layers 132a, 132b, and 132c and the second semiconductor layers 134a, 134b, and 134c have a height H3. In some embodiments, the height H3 of the first semiconductor layers 132a, 132b, and 132c and the second semiconductor layers 134a, 134b, and 134c is similar to or the same as the height H1 of FIGS. 3A, 3B, and 3C. For example, the height H3 is in a range from about 40 nm to 50 nm. In some embodiments, the first semiconductor layers 132a, 132b, and 132c and the second semiconductor layers 134a, 134b, and 134c are substantially at the same horizontal level.

Figures 15A, 15B:
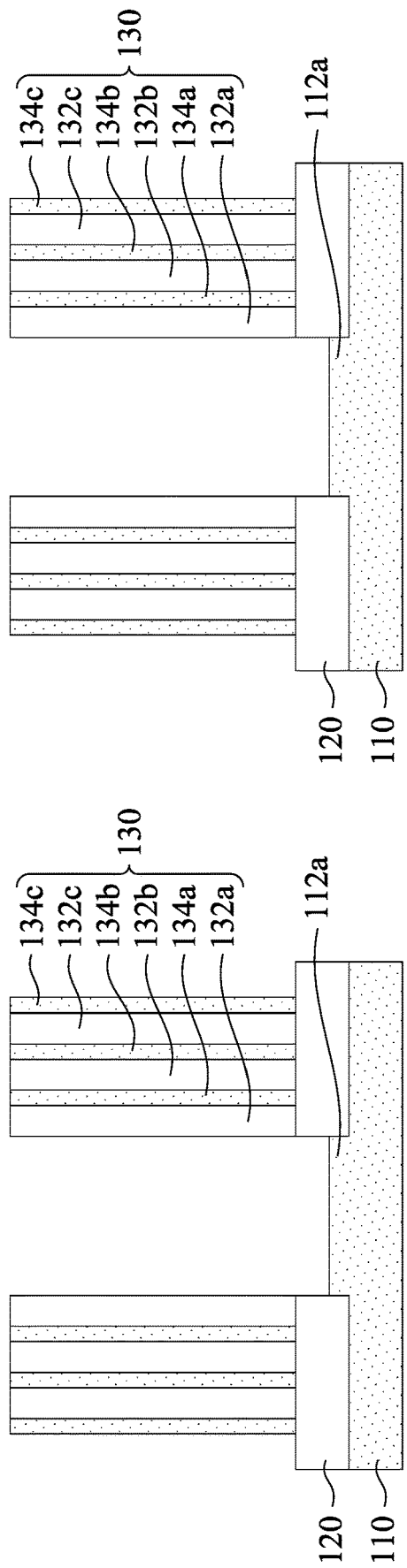
Figure 15C:
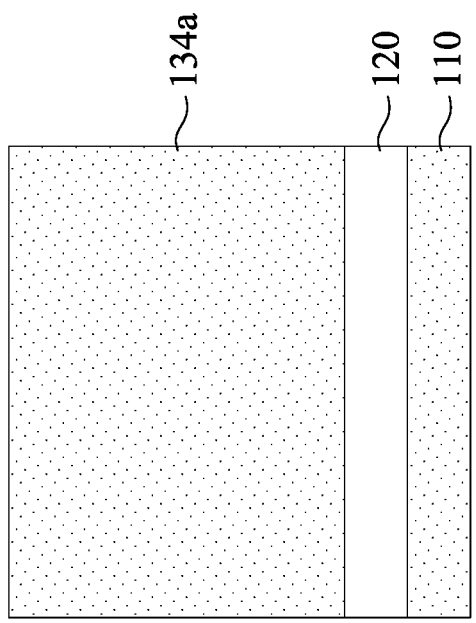

Reference is made to FIGS. 15A, 15B, and 15C. The semiconductor fin 112a over the substrate 110 is partially removed, such that a top surface of the semiconductor fin 112s is below a top surface of the isolation structure 120. In some embodiments, a mask layer is formed over the structure of FIGS. 14A-14C. The mask layer covers the second semiconductor layers 134a, 134b, and 134c and exposes the semiconductor fin 112. The mask layer may be removed after the semiconductor fin 112 is partially removed.

Figure 16A:
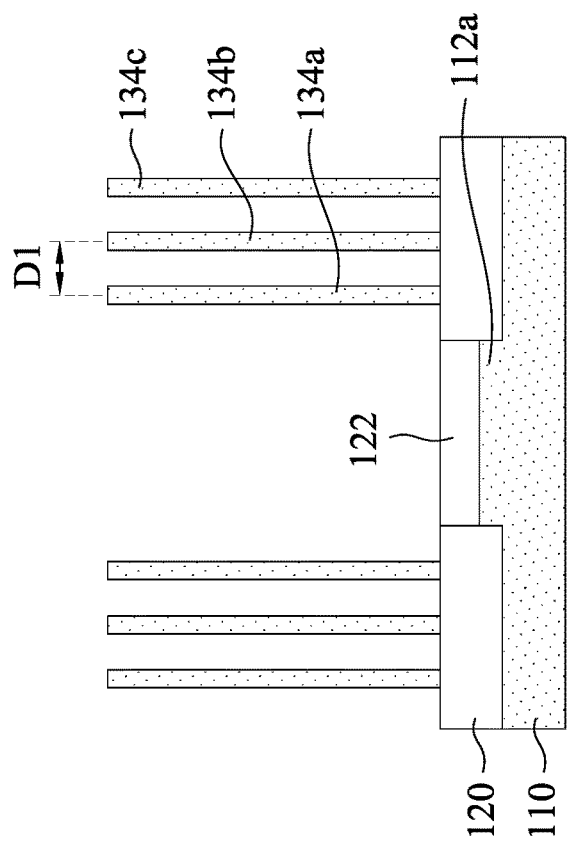
Figure 16B:
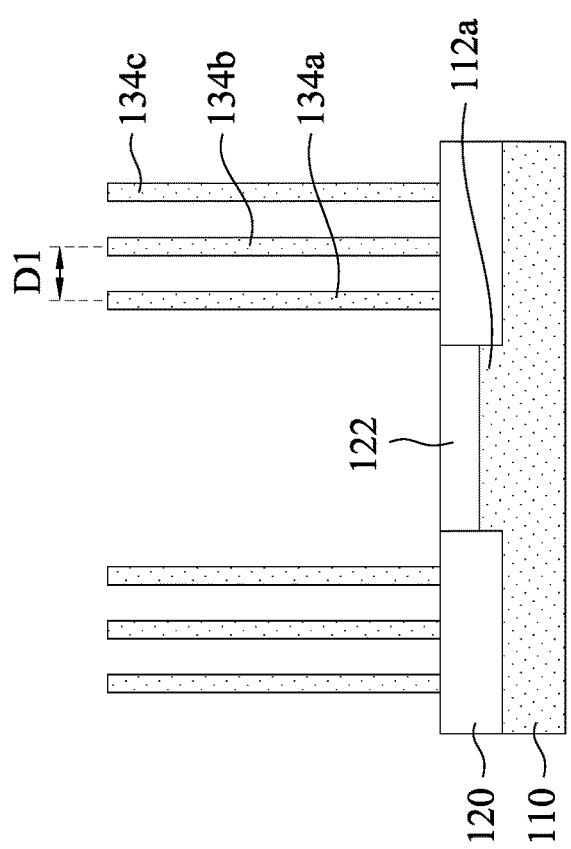
Figure 16C:
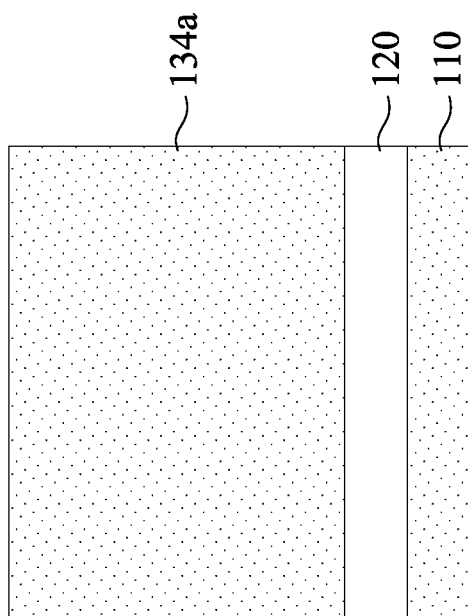

Reference is made to FIGS. 16A, 16B, and 16C. After the semiconductor fin 112a is partially removed, the isolation layer 122 is formed over the semiconductor fin 112, such that the top surface of the isolation layer 122 is substantially at the same horizontal level as a top surface of the isolation structure 120. In some embodiments, the isolation layer 122 is made of an insulator material such as silicon oxide, silicon nitride, or silicon oxynitride. The isolation layer 122 and the isolation structure 120 may include the same materials. In some embodiments, the isolation layer 122 is formed using chemical vapor deposition (CVD), physical vapor deposition (PVD), atomic layer deposition (ALI)), thermal oxide, other suitable processes, or combinations thereof.

Thereafter, the first semiconductor layers 132a, 132b, and 132c (see FIGS. 15A and 15B) of the stacked structure 130 are then removed, thereby forming vertical nanosheets (or nanowires or nanorods or nano-columns) of the second semiconductor layers 134a, 134b, and 134c. The first semiconductor layers 132a, 132b, and 132c can be removed or etched using an etchant that can selectively etch the first semiconductor layers 132a, 132b, and 132c at a faster etching rate than etching the second semiconductor layers 134a, 134b, and 134c.

In some embodiments, each two adjacent second semiconductor layers 134a, 134b, and 134c (e.g., the adjacent second semiconductor layers 134a and 134b) have a pitch D1 therebetween. The pitch D1 is smaller than about 10 nm. For example, the pitch D1 is in a range of about 4 nm to about 10 nm. As such, the lateral dimension can be reduced and thus the scaling down of the semiconductor device can be achieved.

Figure 17C:
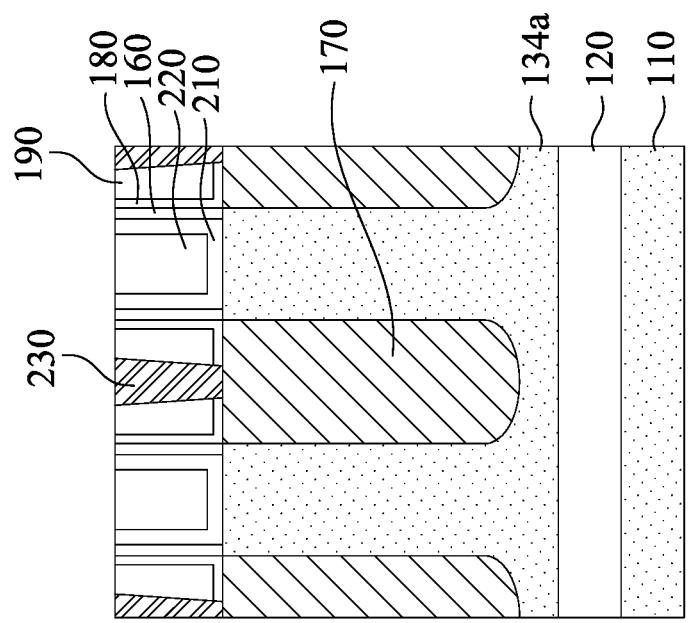

The second semiconductor layers 134a, 134b, and 134c are active regions of the resulting semiconductor device (see FIGS. 17A-17C). In some embodiments, since the second semiconductor layers 134a, 134b, and 134c are in direct contact with the isolation structure 120, the problem of bottom leakage can be avoided or prohibited, thereby improving the performance of the semiconductor device.

Reference is made to FIGS. 17A, 17B, and 17C. Subsequently, similar to FIGS. 6A-12C, the dummy dielectric layer is conformally formed to cover the second semiconductor layers 134a, 134b, and 134c. The dummy gate structure is then formed over dummy dielectric layer. Spacer structure 160 is then formed on opposite sidewalls of the dummy gate structure. The portion of the second semiconductor layers 134a, 134b, and 134c are removed. 134a, 134b, and 134c The epitaxial structures 170 are formed over the second semiconductor layers 134a, 134b, and 134c. The CESL 180 is conformally formed over the epitaxial structures 170, the dummy gate structure 150, the spacer structure 160, the isolation structure 120, and the isolation layer 122. The interlayer dielectric (ILD) 190 is then formed on the CESL 180. The dummy dielectric layer and the dummy gate structure are then replaced with the metal gate structure 200 including the gate dielectric layer 210 and the metal gate electrode 220. The ILD 190 and the CESL 180 are patterned to expose the epitaxial structures 170. Then, the contacts 230 are formed over the epitaxial structures 170.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the second semiconductor layers are direct in contact with the isolation structure, the problem of bottom leakage can be avoided or prohibited. Another advantage is that the thickness of the second semiconductor layers is reduced, such that the problem of short channel effect caused by drain-induced barrier lowering (DIBL) can be improved. Also, the layout area of the semiconductor device is reduced due to the thin active regions (i.e., the second semiconductor layers).

According to some embodiments, a semiconductor device includes a substrate, an isolation structure, a semiconductor fin, a semiconductor layer, and a gate structure. The isolation structure is disposed over the substrate. The semiconductor fin extends from the substrate and in contact with the isolation structure. The semiconductor layer is disposed on and in contact with the isolation structure. The gate structure covers the semiconductor layer and spaced apart from the semiconductor fin.

According to some embodiments, a semiconductor device includes a substrate, an isolation structure, a first semiconductor layer, a second semiconductor layer, a gate structure, and a source/drain epitaxial structure. The isolation structure is disposed over the substrate. The first semiconductor layer and the second semiconductor layer are directly on and in contact with the isolation structure. The gate structure covers channel portions of the first and second semiconductor layers. The source/drain epitaxial structure is disposed over source/drain portions of the first and second semiconductor layers, in which an air gap is defined by the source/drain epitaxial structure, the source/drain portions of the first and second semiconductor layers, and the isolation structure, and a depth of the air gap is substantially the same as a height of the source/drain portions of the first semiconductor layer.

According to some embodiments, a method includes following steps. A semiconductor fin is formed over a substrate. An isolation structure is formed over the substrate and adjacent to the semiconductor fin. A first semiconductor layers and second semiconductor layers are formed in sequence lining sidewalls and a top surface of the semiconductor fin. A selective etching process is performed to remove the first semiconductor layers. A gate structure is formed across the second semiconductor layers. A source/drain epitaxial structure is formed on the second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   an isolation structure over the substrate;
   a semiconductor fin extending from the substrate and in contact with the isolation structure;
   a semiconductor layer on and in contact with the isolation structure, wherein the isolation structure does not directly contact a sidewall of the semiconductor layer;
   a gate structure covering the semiconductor layer and spaced apart from the semiconductor fin;
   a source/drain epitaxial structure over the semiconductor layer; and
   an air gap vertically between the source/drain epitaxial structure and the isolation structure.

2. The semiconductor device of claim 1, wherein a width of the semiconductor layer is less than a width of the semiconductor fin.

3. The semiconductor device of claim 1, wherein a bottom surface of the semiconductor layer is higher than a top surface of the semiconductor fin.

4. The semiconductor device of claim 1, wherein the semiconductor layer is offset from the semiconductor fin in a vertical direction.

5. The semiconductor device of claim 4, wherein the semiconductor layer extends in the vertical direction.

6. The semiconductor device of claim 1, wherein a bottom surface of the gate structure and a bottom surface of the semiconductor layer are substantially coplanar.

7. The semiconductor device of claim 1, wherein the semiconductor fin and the substrate are a continuous semiconductor material.

8. The semiconductor device of claim 1, wherein a bottommost surface of the semiconductor layer is higher than a topmost surface of the semiconductor fin.

9. The semiconductor device of claim 1, wherein the source/drain epitaxial structure extends over the sidewall of the semiconductor layer.

10. A semiconductor device comprising:
    a substrate;
    an isolation structure over the substrate;
    a first semiconductor layer and a second semiconductor layer directly on and in contact with the isolation structure, wherein bottommost surfaces of the first and second semiconductor layers are in direct contact with a topmost surface of the isolation structure;
    a gate structure covering channel portions of the first and second semiconductor layers; and
    a source/drain epitaxial structure over source/drain portions of the first and second semiconductor layers, wherein an air gap is defined by the source/drain epitaxial structure, the source/drain portions of the first and second semiconductor layers, and the isolation structure, and a depth of the air gap is substantially the same as a height of the source/drain portions of the first semiconductor layer.

11. The semiconductor device of claim 10, wherein the first semiconductor layer is spaced apart from the substrate.

12. The semiconductor device of claim 10, wherein the first semiconductor layer extends in a vertical direction.

13. The semiconductor device of claim 10, wherein a width of the first semiconductor layer is in a range from about 4 nm to about 5 nm.

14. The semiconductor device of claim 10, wherein a height of the channel portion of the first semiconductor layer is in a range from about 40 nm to about 50 nm.

15. The semiconductor device of claim 10, wherein the substrate comprises a material substantially the same as that of the first semiconductor layer.

16. A method comprising:
forming a semiconductor fin over a substrate;
forming an isolation structure over the substrate and adjacent to the semiconductor fin;
forming first semiconductor layers and second semiconductor layers in sequence lining sidewalls and a top surface of the semiconductor fin;
partially removing the semiconductor fin over the substrate, such that the top surface of the semiconductor fin is below a top surface of the isolation structure;
forming an isolation layer over the top surface of the semiconductor fin after partially removing the semiconductor fin;
removing a portion of the second semiconductor layers after partially removing the semiconductor fin;
performing a selective etching process to remove the first semiconductor layers;
forming a gate structure across the second semiconductor layers; and
forming a source/drain epitaxial structure on the second semiconductor layers.

17. The method of claim 16, wherein the first semiconductor layers and the second semiconductor layers are made of different materials.

18. The method of claim 16, wherein a thickness of the first semiconductor layers is greater than that of the second semiconductor layers.

19. The method of claim 16, wherein the source/drain epitaxial structure is formed after removing the first semiconductor layers.

20. The method of claim 16, wherein the first semiconductor layers and the second semiconductor layers are formed such that the first semiconductor layers and the second semiconductor layers are in direct contact with the isolation structure.

* * * * *